US011856812B2

(12) United States Patent
Kim et al.

(10) Patent No.: US 11,856,812 B2
(45) Date of Patent: Dec. 26, 2023

(54) DISPLAY DEVICE

(71) Applicant: Samsung Display Co., LTD., Yongin-si (KR)

(72) Inventors: Eun Hye Kim, Namyangju-si (KR); Ki Ho Bang, Hwaseong-si (KR); Eun Ae Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 17/335,071

(22) Filed: Jun. 1, 2021

(65) Prior Publication Data

US 2022/0158126 A1 May 19, 2022

(30) Foreign Application Priority Data

Nov. 18, 2020 (KR) ........................ 10-2020-0154492

(51) Int. Cl.
*H10K 50/844* (2023.01)
*H10K 50/84* (2023.01)
*H10K 59/122* (2023.01)
*H10K 59/131* (2023.01)

(52) U.S. Cl.
CPC ......... *H10K 50/844* (2023.02); *H10K 50/846* (2023.02); *H10K 59/122* (2023.02); *H10K 59/131* (2023.02)

(58) Field of Classification Search
CPC .. H10K 50/844; H10K 50/846; H10K 59/122; H10K 59/132
See application file for complete search history.

(56) References Cited

U.S. PATENT DOCUMENTS

| 9,647,233 | B2 | 5/2017 | Kim et al. |
| 9,947,893 | B2 | 4/2018 | Chao et al. |
| 10,340,476 | B2 | 7/2019 | Park |
| 10,903,294 | B2 | 1/2021 | Bang et al. |
| 10,957,757 | B2 | 3/2021 | Youn et al. |

(Continued)

FOREIGN PATENT DOCUMENTS

| KR | 2016-0110598 | 9/2016 |
| KR | 2017-0033768 | 3/2017 |

(Continued)

*Primary Examiner* — Vongsavanh Sengdara
(74) *Attorney, Agent, or Firm* — H.C. Park & Associates, PLC

(57) ABSTRACT

A display device includes a substrate having a display area and a non-display area, a pixel electrode, an organic emissive layer, a common electrode, a first inorganic encapsulation layer, an organic encapsulation layer, a second inorganic encapsulation layer, a dam, a bank disposed closer to a peripheral edge of the substrate than the dam, an inorganic encapsulation area, wherein the first inorganic encapsulation layer contacts the second inorganic encapsulation layer in the inorganic encapsulation area, and a first voltage supply line in a bank area where the bank is disposed, and in the inorganic encapsulation area. The first voltage supply line includes a plurality of anti-moisture patterns protruding from one side of the first subsidiary voltage supply line and having at least one of a length and a width in the inorganic encapsulation area respectively different from those of the plurality of anti-moisture patterns in the bank area.

17 Claims, 29 Drawing Sheets

(56) References Cited

U.S. PATENT DOCUMENTS

| | | | | |
|---|---|---|---|---|
| 2016/0293883 A1* | 10/2016 | Hong | ................... | H10K 59/131 |
| 2018/0090517 A1* | 3/2018 | Park | ................... | H01L 27/1244 |
| 2018/0123060 A1* | 5/2018 | Jang | ................... | H10K 77/111 |
| 2019/0006442 A1* | 1/2019 | Byun | ................... | H10K 59/124 |
| 2020/0168685 A1* | 5/2020 | Bang | ................... | H01L 27/1244 |
| 2020/0176550 A1* | 6/2020 | Youn | ................... | H10K 59/1315 |
| 2020/0194719 A1* | 6/2020 | Choi | ................... | H10K 77/111 |

FOREIGN PATENT DOCUMENTS

| | | |
|---|---|---|
| KR | 2018-0107414 | 10/2018 |
| KR | 2020-0066498 | 6/2020 |

\* cited by examiner

DISPLAY DEVICE

CROSS-REFERENCE TO RELATED APPLICATION

This application claims priority from and the benefit of Korean Patent Application No. 10-2020-0154492, filed on Nov. 18, 2020, which is hereby incorporated by reference for all purposes as if fully set forth herein.

BACKGROUND

Field

Embodiments of the invention relate generally to a display device.

Discussion of the Background

As the information-oriented society evolves, various demands for display devices are ever increasing. For example, display devices are being employed by a variety of electronic devices such as smart phones, digital cameras, laptop computers, navigation devices, and smart televisions.

Display devices may include flat panel display devices such as a liquid-crystal display device, a field emission display device, and a light-emitting display device. Light-emitting display devices include an organic light-emitting display device including an organic light-emitting element, an inorganic light-emitting display device including an inorganic light-emitting element such as an inorganic semiconductor, and a micro-light-emitting display device including an ultra-small light-emitting element.

Recently, in order to increase a display area in which emission areas for displaying images are arranged, a bezel area or a non-display area other than the display area has been reduced. For an organic light-emitting display device including organic light-emitting elements, an inorganic encapsulation area for encapsulating the organic light-emitting elements of the emission areas may be disposed in a non-display area. However, as the bezel area or the non-display area is reduced, the width of the inorganic encapsulation area may be reduced. Accordingly, when an air gap is generated in the inorganic encapsulation area, the path through which air or moisture permeates becomes shorter, and thus the organic light-emitting elements of the emission areas adjacent to the inorganic encapsulation area are more likely to be damaged by air or moisture. Once the organic light-emitting elements of the emission areas are damaged by air or moisture, they may look like black spots on the display area.

The above information disclosed in this Background section is only for understanding of the background of the inventive concepts, and, therefore, it may contain information that does not constitute prior art.

SUMMARY

Devices constructed according to implementations/embodiments of the invention are capable of reducing the possibility of damage due to air or moisture to light emitting elements provided on a display device having a reduced-in-size non-display area.

Display devices constructed according to one or more embodiments of the invention are capable of preventing organic light-emitting elements of emission areas adjacent to an inorganic encapsulation area from being damaged by air or moisture even though the width of the inorganic encapsulation area is reduced.

Additional features of the inventive concepts will be set forth in the description which follows, and in part will be apparent from the description, or may be learned by practice of the inventive concepts.

A display device according to an embodiment includes a substrate having a display area and a non-display area, a pixel electrode disposed on the display area of the substrate, an organic emissive layer disposed on the pixel electrode, a common electrode disposed on the organic emissive layer, a first inorganic encapsulation layer disposed on the common electrode, an organic encapsulation layer disposed on the first inorganic encapsulation layer, a second inorganic encapsulation layer disposed on the organic encapsulation layer, a dam disposed on the non-display area of the substrate, a bank disposed on the non-display area of the substrate and disposed closer to a peripheral edge of the substrate than the dam, an inorganic encapsulation area located between the dam and the bank in the non-display area of the substrate, wherein the first inorganic encapsulation layer is in contact with the second inorganic encapsulation layer in the inorganic encapsulation area, and a first voltage supply line disposed in a dam area where the dam is disposed, in a bank area where the bank is disposed, and in the inorganic encapsulation area in the non-display area of the substrate. The first voltage supply line comprises a first subsidiary voltage supply line; and a plurality of anti-moisture patterns protruding from one side of the first subsidiary voltage supply line and disposed in the inorganic encapsulation area. A length and/or a width of the plurality of anti-moisture patterns in the inorganic encapsulation area is respectively different from a length and/or a width of the plurality of anti-moisture patterns in the bank area.

A display device according to an embodiment includes a substrate having a display area and a non-display area, a pixel electrode disposed on the display area of the substrate, an organic emissive layer disposed on the pixel electrode, a common electrode disposed on the organic emissive layer, a first inorganic encapsulation layer disposed on the common electrode, an organic encapsulation layer disposed on the first inorganic encapsulation layer, a second inorganic encapsulation layer disposed on the organic encapsulation layer, a dam disposed on the non-display area of the substrate, a bank disposed on the non-display area of the substrate and disposed closer to a peripheral edge of the substrate than the dam, an inorganic encapsulation area located between the dam and the bank in the non-display area of the substrate, wherein the first inorganic encapsulation layer is in contact with the second inorganic encapsulation layer in the inorganic encapsulation area, and a first voltage supply line disposed in a dam area where the dam is disposed, in a bank area where the bank is disposed, and in the inorganic encapsulation area in the non-display area of the substrate. The first voltage supply line comprises a first subsidiary voltage supply line, and a plurality of first anti-moisture patterns recessed from one side of the first subsidiary voltage supply line and disposed in the inorganic encapsulation area.

A display device according to an embodiment includes a substrate including a display area and a non-display area, a pixel electrode disposed on the display area of the substrate, an organic emissive layer disposed on the pixel electrode, a common electrode disposed on the organic emissive layer, a first inorganic encapsulation layer disposed on the common electrode, an organic encapsulation layer disposed on the first inorganic encapsulation layer, a second inorganic encapsulation layer disposed on the organic encapsulation layer, a dam disposed on the non-display area of the substrate, an inorganic encapsulation area disposed on an outer side of the dam in the non-display area, wherein the first inorganic encapsulation layer is in contact with the second inorganic encapsulation layer in the inorganic encapsulation area, and a first voltage supply line disposed in a dam area where the dam is disposed, in a first non-display area between the display area and the dam area, and in the inorganic encapsulation area in the non-display area of the substrate, and comprising a plurality of anti-moisture patterns. The plurality of anti-moisture patterns comprises a first anti-moisture pattern disposed in the first non-display area and a second anti-moisture pattern disposed in the inorganic encapsulation area. A shape of the first anti-moisture pattern is different from a shape of the second anti-moisture pattern when viewed from above the display device.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION OF THE EMBODIMENTS

Figure 1:
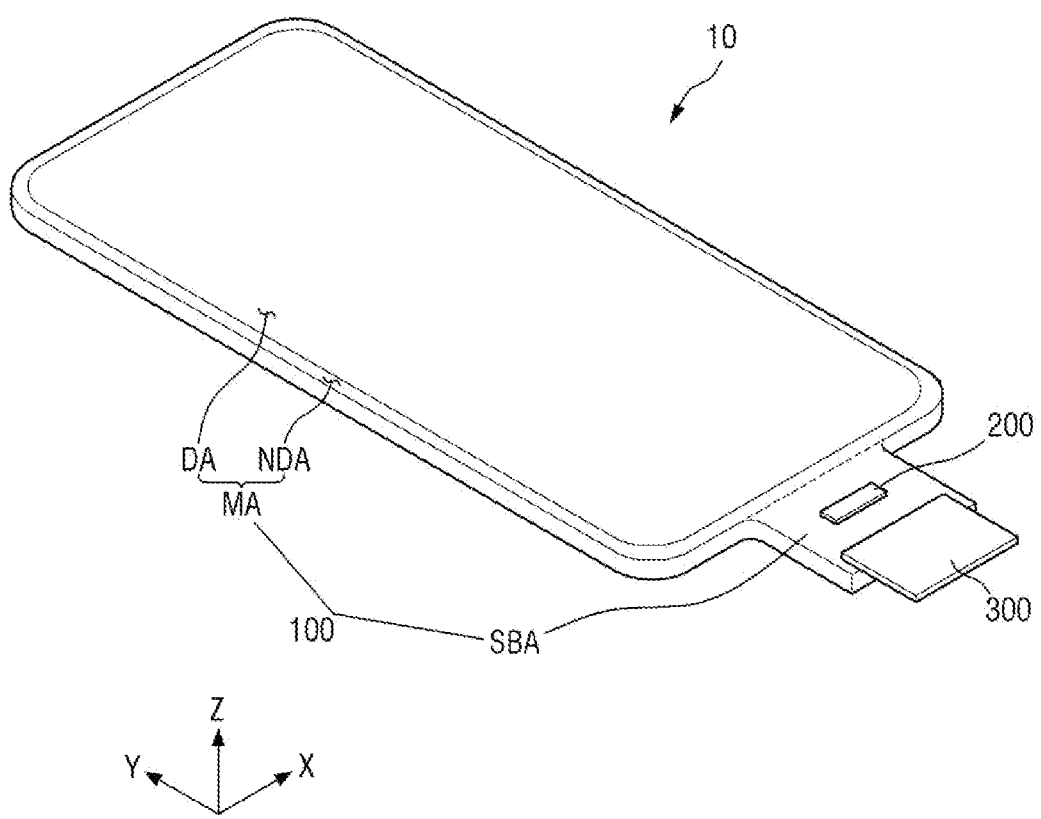
FIG. 1 is a perspective view of a display device according to an embodiment constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly. As used herein "in plan view" means as viewed from a position normal to a plane of a substrate.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display device according to an embodiment constructed according to principles of the invention.

Referring to FIG. 1, a display device 10 is for displaying moving images or still images. The display device 10 may be used as the display screen of portable electronic devices such as a mobile phone, a smart phone, a tablet personal computer (tablet PC), a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard, and the Internet of Things (IoT).

The display device 10 may be a light-emitting display device such as an organic light-emitting display device using organic light-emitting diodes, a quantum-dot light-emitting display device including quantum-dot light-emitting layer, an inorganic light-emitting display device including an inorganic semiconductor, and an ultra-small light-emitting display device using micro or nano light-emitting diodes (micro LEDs or nano LEDs). In the following description, an organic light-emitting display device is described as an example of the display device 10. It is, however, to be understood that the present disclosure is not limited thereto.

The display device 10 includes a display panel 100, a display driver circuit 200 and a circuit board 300.

The display panel 100 may be formed in a rectangular plane having shorter sides in a first direction (x-axis direction) and longer sides in a second direction (y-axis direction) intersecting the first direction (x-axis direction). Each of the corners where the short side in the first direction (x-axis direction) meets the longer side in the second direction (y-axis direction) may be rounded with a predetermined curvature or may be a right angle. The shape of the display panel 100 when viewed from the top is not limited to a quadrangular shape, but may be formed in a different polygonal shape, a circular shape, or an elliptical shape. The display panel 100 may be formed flat, but is not limited thereto. For example, the display panel 100 may be formed at left and right ends, and may include a curved portion having a constant curvature or a varying curvature. In addition, the display panel 100 may be formed to be flexible so that it can be curved, bent, folded or rolled.

A substrate SUB of the display panel 100 may include the main area MA and a subsidiary area SBA.

Figure 2:
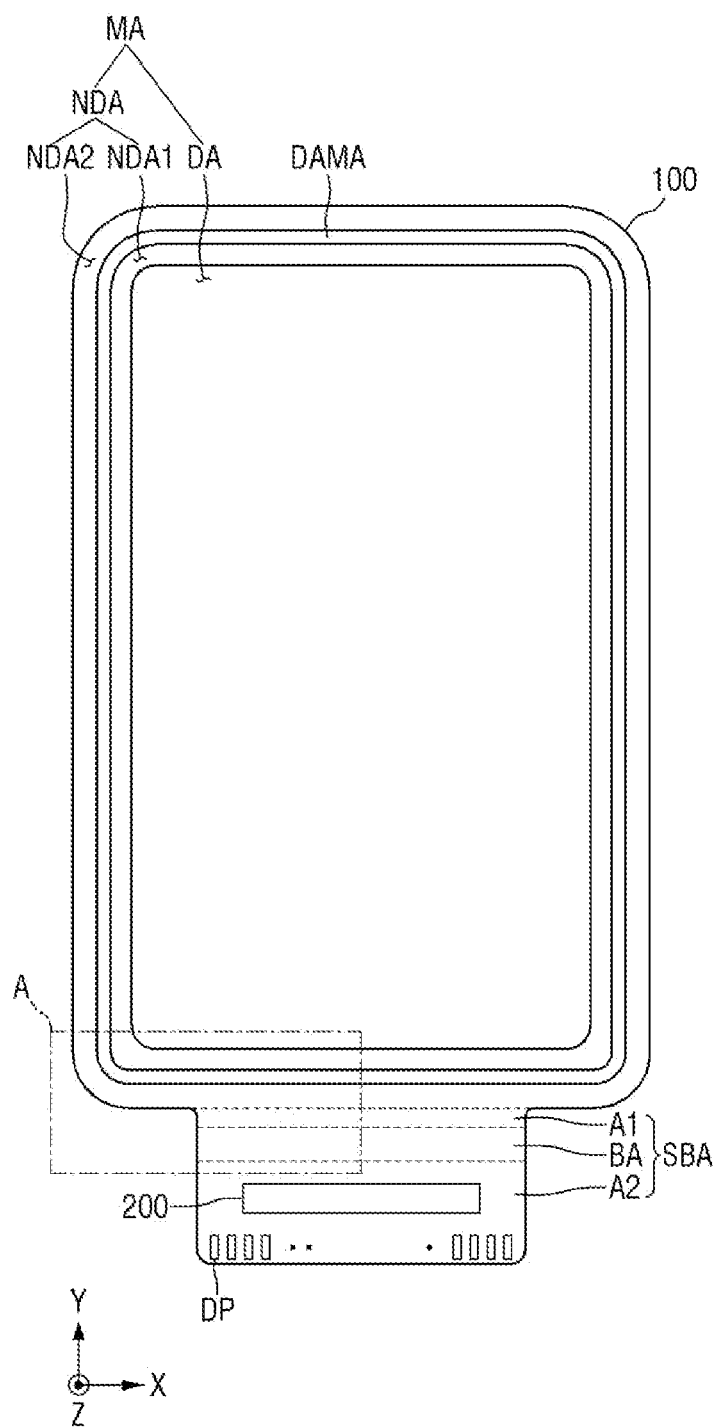
FIGS. 2 and 3 are plan views showing a display device according to an embodiment.

The main area MA may include a display area DA where images are displayed, and a non-display area NDA around the display area DA. The display area DA may include pixels PX (see FIGS. 5A and 5B) that display images. The subsidiary area SBA may protrude from one side of the main area MA in the second direction (y-axis direction), such as from a bottom of the display panel 100 as shown in FIG. 2.

Although the subsidiary area SBA is unfolded in the example shown in FIG. 1, the subsidiary area SBA may be bent and may be disposed on the lower surface of the display panel 100. When the subsidiary area SBA is bent, it may overlap the main area MA in the thickness direction (z-axis direction) of the substrate SUB. The display driver circuit 200 may be disposed in the subsidiary area SBA.

The display driver circuit 200 may generate signals and voltages for driving the display panel 100. The display driver circuit 200 may be implemented as an integrated circuit (IC) and may be attached to the display panel 100 by a chip on glass (COG) technique, a chip on plastic (COP) technique, or an ultrasonic bonding. It is, however, to be understood that the present disclosure is not limited thereto. For example, the display driver circuit 200 may be attached on the circuit board 300 by the chip-on-film (COF) technique.

The circuit board 300 may be attached to one end of the subsidiary area SBA of the display panel 100. Accordingly, the circuit board 300 may be electrically connected to the display panel 100 and the display driver circuit 200. The display panel 100 and the display driver circuit 200 may receive digital video data, timing signals, and driving voltages through the circuit board 300. The circuit board 300 may be a flexible printed circuit board, a printed circuit board, or a flexible film such as a chip on film.

Figure 3:
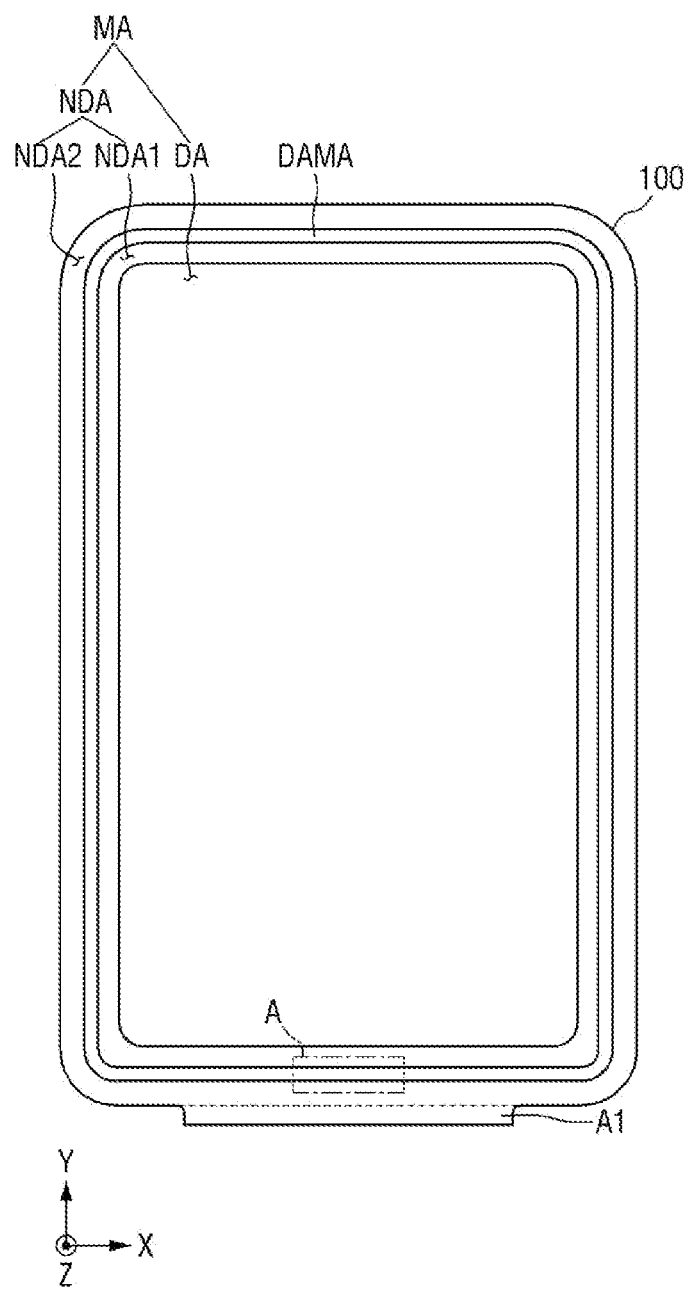
Figure 4:
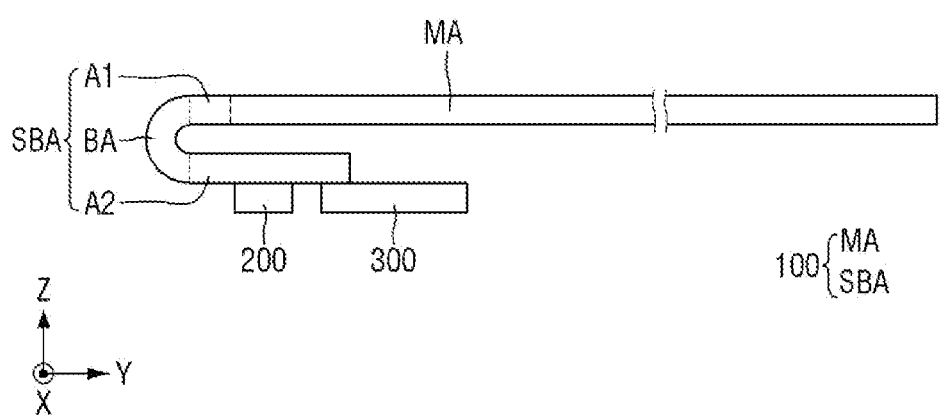
FIG. 4 is a side view showing a display device according to an embodiment.

FIGS. 2 and 3 are plan views showing a display device according to an embodiment. FIG. 4 is a side view showing a display device according to an embodiment.

FIG. 2 shows that the subsidiary area SBA is unfolded without being bent. FIGS. 3 and 4 show that the subsidiary area SBA is bent.

Referring to FIGS. 2 to 4, the display panel 100 may include the main area MA and the subsidiary area SBA.

The main area MA may include a display area DA where images are displayed, and a non-display area NDA around the display area DA. The display area DA may occupy most of the main area MA. The display area DA may be disposed at the center of the main area MR.

The non-display area NDA may be disposed adjacent to the display area DA. The non-display area NDA may be disposed on the outer side of the display area DA. The non-display area NDA may surround the display area DA. The non-display area NDA may be defined as the border of the display panel 100.

The non-display area NDA may include a dam area DAMA. The dam area DAMA may be disposed to surround the display area DA. In the dam area DAMA, a dam DAM (see FIG. 10) for preventing overflow of an organic encapsulation layer TFE2 of an encapsulation layer TFEL (see FIG. 6) for encapsulating the light-emitting elements in the display area DA may be disposed.

The non-display area NDA may include a first non-display area NDA1 disposed between the display area DA and the dam area DAMA, and a second non-display area NDA2 disposed outside the dam area DAMA. In other words, the first non-display area NDA1 may be disposed on the inner side of the dam area DAMA, and the second non-display area NDA2 may be disposed on the outer side of the dam area DAMA.

The subsidiary area SBA may protrude from one side of the main area MA in the second direction (y-axis direction). The length of the subsidiary area SBA in the second direction (y-axis direction) may be smaller than the length of the main area MA in the second direction (y-axis direction). The length of the subsidiary area SBA in the first direction (x-axis direction) may be substantially equal to or smaller than the length of the main area MA in the first direction (x-axis direction). The subsidiary area SBA may be bent and may be disposed on the rear side of the display panel 100. In such case, the subsidiary area SBA may overlap with the main area MA in the third direction (z-axis direction).

The subsidiary area SBA may include a first area A1, a second area A2 and a bending area BA.

The first area A1 protrudes from one side of the main area MA in the second direction (y-axis direction). One side of the first area A1 may be in contact with the non-display area NDA of the main area MA, and the opposite side of the first area A1 may be in contact with the bending area BA.

In the second area A2, display pads DP and the display driver circuit 200 are disposed. The display driver circuit 200 may be attached on driver pads of the second area A2 using a low-resistance, high-reliability material such as an anisotropic conductive film and self assembly anisotropic conductive paste (SAP). The circuit board 300 may be attached on the display pads DP of the second area A2 using a low-resistance, high-reliability material such as an anisotropic conductive film and SAP. One side of the second area A2 may be in contact with the bending area BA.

The bending area BA is a part of the display panel 100 that is bendable. When the bending area BA is bent, the second area A2 may be disposed under the first area A1 and under the main area MA. The bending area BA may be disposed between the first area A1 and the second area A2. One side of the bending area BA may be in contact with the first area A1, and the opposite side of the bending area BA may be in contact with the second area A2.

Figure 5A:
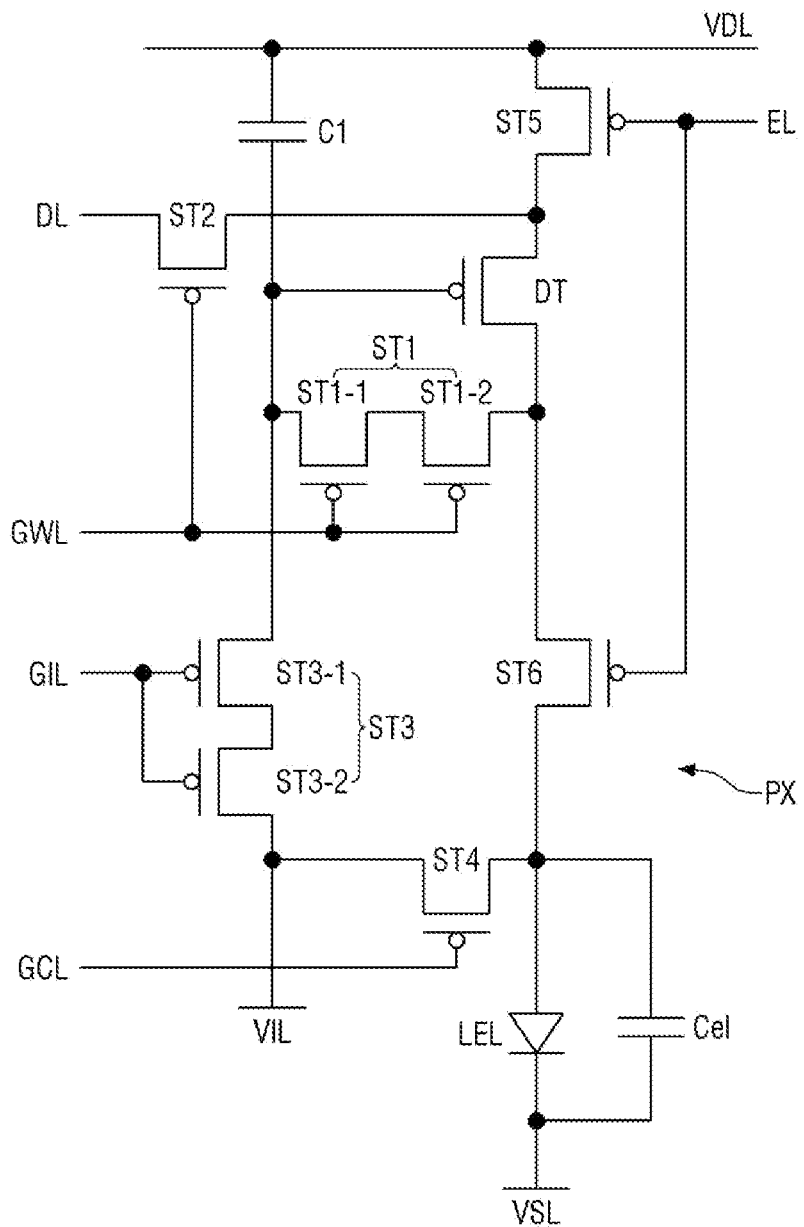
FIG. 5A is a circuit diagram showing a pixel in a display area of a display panel according to an embodiment.

FIG. 5A is a circuit diagram showing a pixel in a display area of a display panel according to an embodiment.

Referring to FIG. 5A, each of the pixels PX may be connected to two of the scan lines SL, one of the emission lines EL, and one of the data lines. For example, as shown in FIG. 5A, each of the pixels PX may be connected to a write scan line GWL, an initialization scan line GIL, a control scan line GCL, an emission line EL, and a data line DL.

The pixel PX includes a driving transistor DT, a light-emitting element LE, switch elements, and a capacitor C1 as shown in FIG. 5A. The switch elements include first to sixth transistors ST1, ST2, ST3, ST4, ST5 and ST6.

The driving transistor DT includes a gate electrode, a first electrode, and a second electrode. The drain-source current Ids (hereinafter referred to as "driving current") of driving transistor DT flowing between the first electrode and the second electrode is controlled according to the data voltage applied to the gate electrode.

The light-emitting element LEL emits light as the driving current Ids flows therein. The amount of the light emitted from the light-emitting element LEL may be proportional to the driving current Ids.

The light-emitting element LEL may be an organic light-emitting diode including an anode electrode, a cathode electrode, and an organic emissive layer disposed between the anode electrode and the cathode electrode. Alternatively, the light-emitting element LEL may be an inorganic light-emitting element including an anode electrode, a cathode electrode, and an inorganic semiconductor disposed between the anode electrode and the cathode electrode. Alternatively, the light-emitting element LEL may be a quantum-dot light-emitting element including an anode electrode, a cathode electrode, and a quantum-dot emissive layer disposed between the anode electrode and the cathode electrode. Alternatively, the light-emitting element LEL may be a micro light-emitting diode.

The anode electrode of the light-emitting element LEL may be connected to the first electrode of the fourth transistor ST4 and the second electrode of the sixth transistor ST6, while the cathode electrode thereof may be connected to a first voltage supply line VSL. A parasitic capacitance Cel may be formed between the anode electrode and the cathode electrode of the light-emitting element LEL.

The capacitor C1 is formed between the second electrode of the driving transistor DT and a second voltage supply line VDL. One electrode of the capacitor C1 may be connected to the second electrode of the driving transistor DT while the other electrode thereof may be connected to the second voltage supply line VDL.

When the first electrode of each of the first to sixth transistors ST1, ST2, ST3, ST4, ST5 and ST6 and the driving transistor DT is a source electrode, the second electrode thereof may be a drain electrode. Alternatively, when the first electrode of each of the first to sixth transistors ST1, ST2, ST3, ST4, ST5 and ST6 and the driving transistor DT is a drain electrode, the second electrode thereof may be a source electrode.

The active layer of each of the first to sixth transistors ST1, ST2, ST3, ST4, ST5 and ST6 and the driving transistor DT may be made of one of poly silicon, amorphous silicon and oxide semiconductor. When the semiconductor layer of each of the first to sixth transistors ST1 to ST6 and the driving transistor DT is made of poly silicon, a low-temperature poly silicon (LTPS) process may be employed.

Although the first to sixth transistors ST1, ST2, ST3, ST4, ST5 and ST6 and the driving transistor DT are of p-type metal oxide semiconductor field effect transistors (MOSFETs) in FIG. 5A, this is merely illustrative. They may be of n-type MOSFETs.

Moreover, a first supply voltage from the first voltage supply line VSL, a second supply voltage from the second voltage supply line VDL, and a third supply voltage from a third voltage supply line VIL may be determined based on the characteristics of the driving transistor DT, the characteristics of the light-emitting element LEL, etc.

Figure 5B:
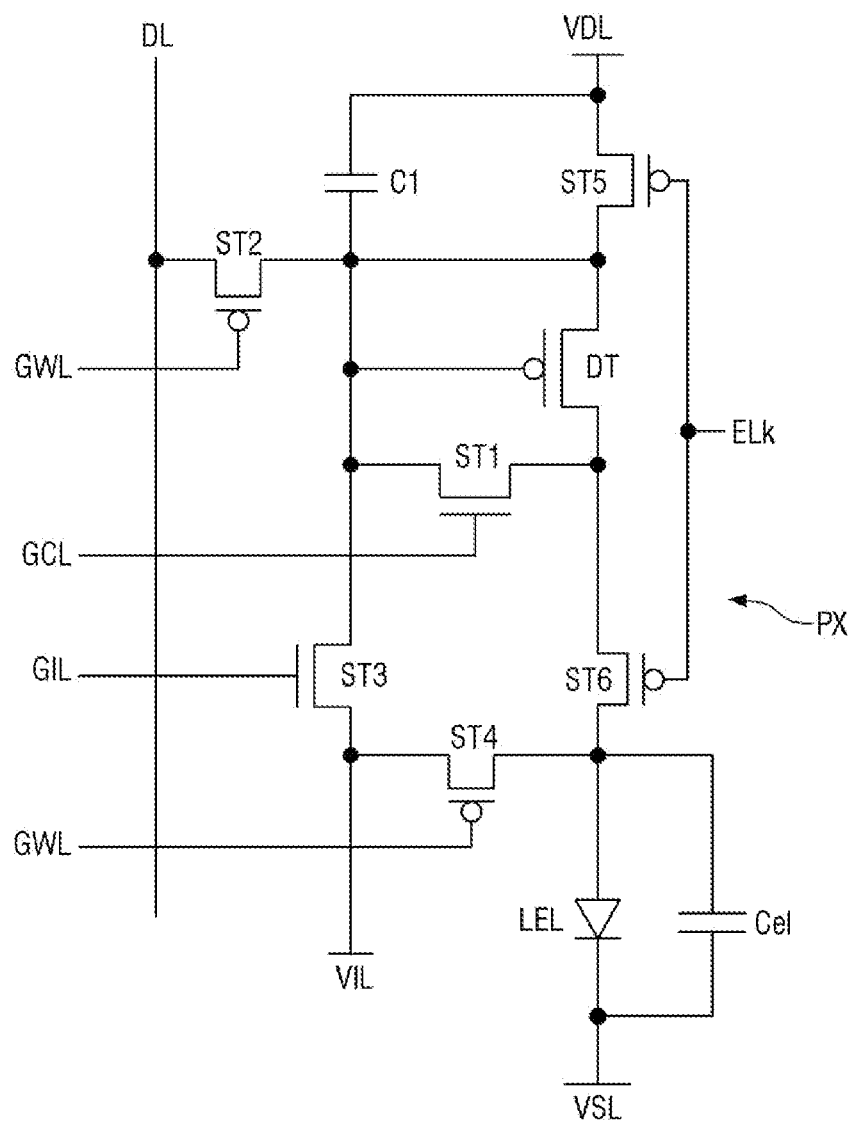
FIG. 5B is a circuit diagram showing a pixel in a display area of a display panel according to yet another embodiment.

FIG. 5B is a circuit diagram showing a pixel in a display area of a display panel according to yet another embodiment.

The embodiment of FIG. 5B is different from the embodiment of FIG. 5A in that the driving transistor DT, the second transistor ST2, the fourth transistor ST4, the fifth transistor ST5 and the sixth transistor ST6 are implemented as p-type MOSFETs while the first transistor ST1 and the third transistor ST3 are implemented as n-type MOSFETs.

Referring to FIG. 5B, the active layer of each of the driving transistor DT, the second transistor ST2, the fourth transistor ST4, the fifth transistor ST5 and the sixth transistor ST6 implemented as p-type MOSFETs may be made of polysilicon, and the active layer of the first transistor ST1 and the third transistor ST3 implemented as n-type MOSFETs may be made of oxide semiconductor. In such case, since transistors formed of polysilicon and transistors formed of an oxide semiconductor may be disposed on different layers, the area of the pixel PX may be reduced.

The embodiment of FIG. 5B is different from the embodiment of FIG. 6A in that the gate electrode of the second transistor ST2 and the gate electrode of the fourth transistor ST4 are connected to the write scan line GWL, and the gate electrode of the first transistor ST1 is connected to the control scan line GCL. In addition, in FIG. 5B, since the first transistor ST1 and the third transistor ST3 are formed of n-type MOSFETs, a scan signal of a gate-high voltage may be applied to the control scan line GCL and the initialization scan line GIL. In contrast, since the second transistor ST2, the fourth transistor ST4, the fifth transistor ST5 and the sixth transistor ST6 are formed of p-type MOSFETs, a scan signal of a gate low voltage may be applied to the write scan line GWL and the emission line EL.

Figure 5C:
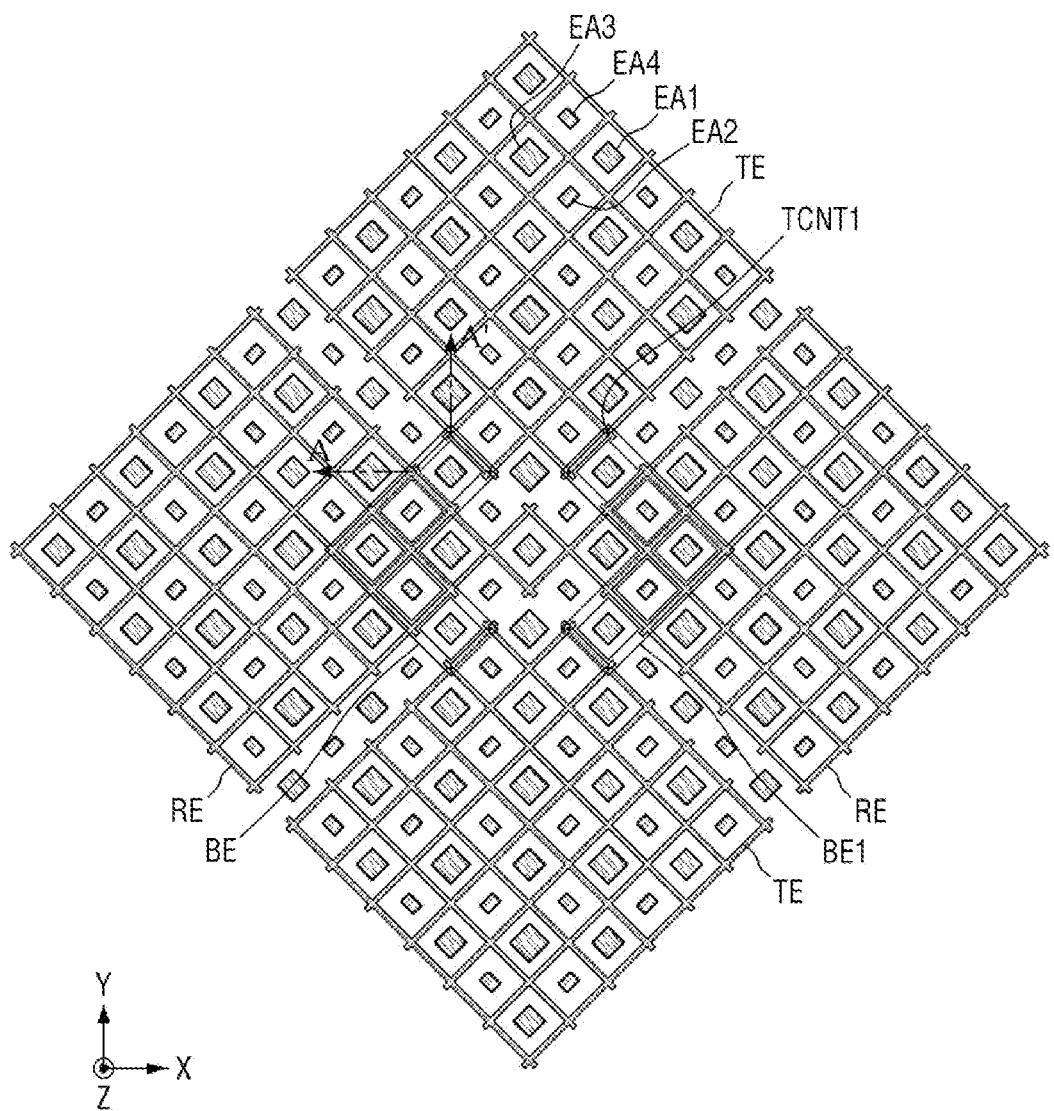
FIG. 5C is a layout diagram showing a display area of a display panel according to an embodiment.

FIG. 5C is a layout diagram showing a display area of a display panel according to an embodiment.

FIG. 5C shows first to fourth emission areas EA1, EA2, EA3 and EA4, driving electrodes TE, and sensing electrodes RE in the display area DA. In the example shown in FIG. 5C, a user's touch is sensed by mutual capacitive sensing by using two kinds of sensor electrodes, i.e., driving electrodes TE and sensing electrodes RE. For convenience of illustration, FIG. 5C shows only two sensing electrodes RE adjacent to each other in the first direction (x-axis direction) and two driving electrodes TE adjacent to each other in the second direction (y-axis direction).

Referring to FIG. 5C, the driving electrodes TE may be electrically separated from the sensing electrodes RE. The driving electrodes TE and the sensing electrodes RE are formed on the same layer and thus they may be spaced apart from each other. There may be a gap between the driving electrodes TE and the sensing electrodes RE.

The sensing electrodes RE may be electrically connected to one another in the first direction (x-axis direction). The driving electrodes TE may be electrically connected to one another in the second direction (y-axis direction). In order to electrically separate the sensing electrodes RE from the driving electrodes TE at their intersections, the driving electrodes TE adjacent to one another in the second direction (y-axis direction) may be connected through the first bridge portions BEL The sensing electrodes RE may be connected to sensing lines, and the driving electrodes TE may be connected to driving lines. The sensing lines and the driving lines may be collectively referred to as touch lines TL (see FIGS. 10 and 11).

The first bridge portions BE1 may be formed on a different layer from the driving electrodes TE and the sensing electrodes RE and may be connected to the driving electrodes TE through first sensor contact holes TCNT1. One end of each of the first bridge portions BE1 may be connected to one of the driving electrodes TE adjacent to each other in the second direction (y-axis direction) through the first sensor contact holes TCNT1. The other end of each of the first bridge portions BE1 may be connected to another one of the driving electrodes TE adjacent to each other in the second direction (y-axis direction) through the first sensor contact holes TCNT1. The first bridge portions BE1 may overlap the sensing electrodes RE in the third direction (z-axis direction). Since the first bridge portions BE1 are formed on a different layer from the driving electrodes TE and the sensing electrodes RE, they can be electrically separated from the sensing electrodes RE even though they overlap the sensing electrodes RE in the third direction (z-axis direction).

The display area DA may include a plurality of emission areas EA1, EA2, EA3 and EA4 for displaying images. Each of the plurality of emission areas EA1, EA2, EA3 and EA4 may be defined as an area in which the light-emitting element LEL of FIGS. 5A and 5B emits light.

For example, the display area DA may include first to fourth emission areas EA1, EA2, EA3 and EA4. In this instance, the first emission area EA1 may refer to the emission area of a light-emitting element LEL (see FIGS. 5A and 5B) that emits first light, and the second emission area EA2 may refer to an area of a light-emitting element LEL (see FIGS. 5A and 5B) that emits second light. In addition, the third emission area EA3 may refer to an area of a light-emitting element LEL (see FIGS. 5A and 5B) that emits third light, and the fourth emission area EA4 may refer to an area of a light-emitting element LEL (see FIGS. 5A and 5B) that emits fourth light.

The first emission area EA1, the second emission area EA2, the third emission area EA3 and the fourth emission area EA4 may emit lights of different colors. Alternatively, two of the first emission area EA1, the second emission area EA2, the third emission area EA3 and the fourth emission area EA4 may emit light of the same color. For example, the first emission area EA1 may emit light of red color, the second emission area EA2 and the fourth emission area EA4 may emit light of green color, and the third emission area EA3 may emit light of blue color. Each of the first emission area EA1, the second emission area EA2, the third emission area EA3 and the fourth emission area EA4 may have, but is not limited to, a quadrangular shape such as a rhombus when viewed from the top. For example, the first emission area EA1, the second emission area EA2, the third emission area EA3 and the fourth emission area EA4 may have other polygonal shape than a quadrangular shape, a circular shape, or an elliptical shape when viewed from the top. In the example shown in FIG. 6, the third emission area EA3 has the largest area, the first emission area EA1 has the second largest area, and the second emission area EA2 and the fourth emission area EA4 have the smallest area. It is, however, to be understood that the embodiment described herein is not limited thereto.

Since the driving electrodes TE, the sensing electrodes RE and the bridge portions BE1 are formed in a mesh structure when viewed from the top, the emission areas EA1, EA2, EA3 and EA4 may not overlap the driving electrodes TE, the sensing electrodes RE and the bridge portions BE1 in the third direction (z-axis direction). Accordingly, the light emitted from the emission areas EA is blocked by the driving electrodes TE, the sensing electrodes RE and the bridge portions BE1, and thus it is possible to avoid or reduce the luminance of the light from being lowered.

Figure 6:
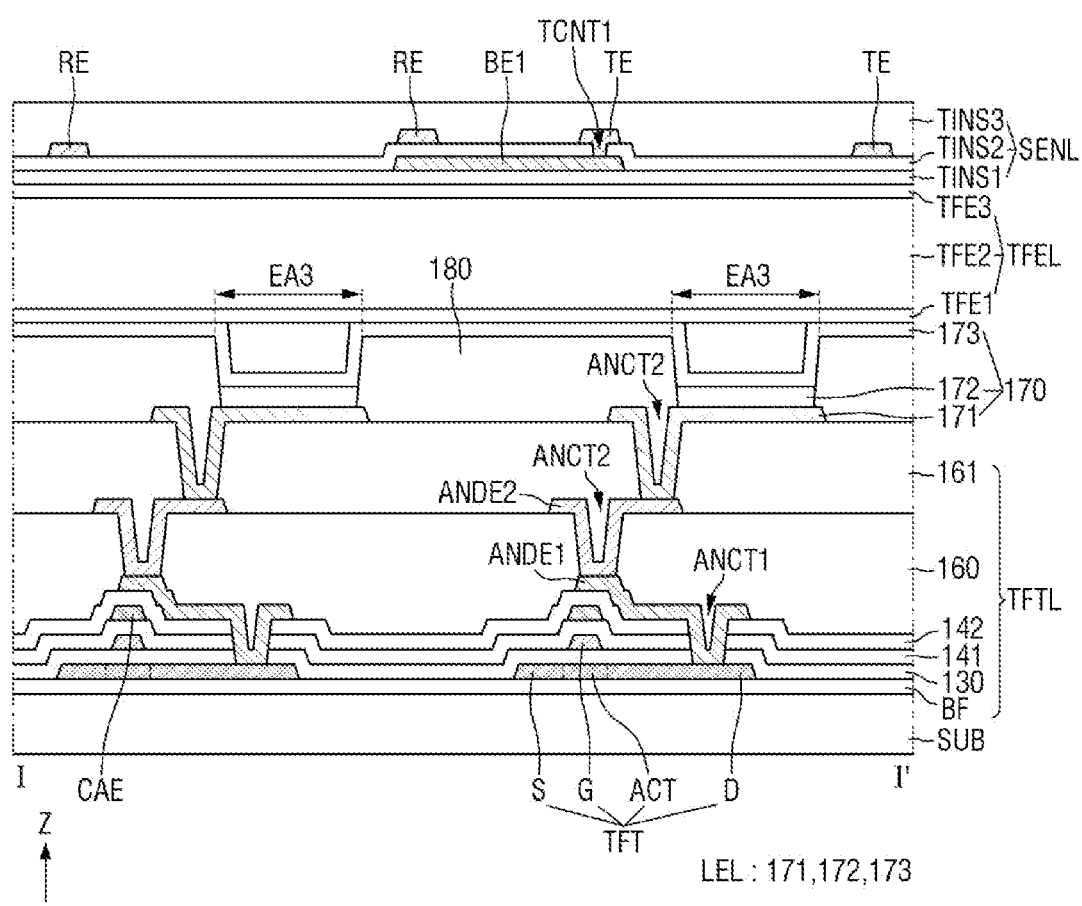
FIG. 6 is a cross-sectional view showing an example of the display panel taken along line A-A' of FIG. 5C.

FIG. 6 is a cross-sectional view showing an example of the display panel taken along line A-A' of FIG. 5C.

Referring to FIG. 6, the substrate SUB may be made of an insulating material such as a polymer resin and glass. For example, the substrate SUB may include polyimide. In such case, the substrate SUB may be a flexible substrate that can be bent, folded, or rolled.

A thin-film transistor layer TFTL including thin-film transistors TFT may be disposed on the substrate SUB. The thin-film transistor layer TFTL may include a thin-film transistor TFT, a capacitor C1, a first anode connection electrode ANDE1, a second anode connection electrode ANDE2, a buffer film BF, a gate insulating layer 130, a first interlayer dielectric layer 141, a second interlayer dielectric layer 142, a first organic layer 160, and a second organic layer 161.

The buffer film BF may be disposed on the substrate SUB. The buffer film BF may be formed of a silicon nitride layer, a silicon oxynitride layer, a silicon oxide layer, a titanium oxide layer, or an aluminum oxide layer.

The thin-film transistor TFT may be disposed on the buffer film BF. The thin-film transistor TFT may include an active layer ACT, a gate electrode G, a source electrode S, and a drain electrode D.

The active layer ACT, the source electrode S and the drain electrode D of the thin-film transistor TFT may be disposed on the buffer film BF. The active layer ACT may include silicon semiconductor such as polycrystalline silicon, monocrystalline silicon, low-temperature polycrystalline silicon and amorphous silicon. The source electrode S and the drain electrode D may have conductivity by doping a silicon semiconductor with ions or impurities. The active layer ACT may overlap the gate electrode G in the third direction (z-axis direction), which is the thickness direction of the substrate SUB, and the source electrode S and the drain electrode D may not overlap the gate electrode G in the third direction (z-axis direction).

The gate insulating layer 130 may be disposed on the active layer ACT, the source electrode S and the drain electrode D of the thin-film transistor TFT. The gate insulating layer 130 may be formed of an inorganic layer, for example, a silicon nitride layer, a silicon oxynitride layer, a silicon oxide layer, a titanium oxide layer, or an aluminum oxide layer.

The gate electrode G of the thin-film transistor TFT may be disposed on the gate insulating layer 130. The gate electrode G may overlap the active layer ACT in the third direction (z-axis direction). The gate electrode G may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first interlayer dielectric layer 141 may be disposed on the gate electrode G. The first interlayer dielectric layer 141 may be formed of an inorganic layer, for example, a silicon nitride layer, a silicon oxynitride layer, a silicon oxide layer, a titanium oxide layer, or an aluminum oxide layer.

A capacitor electrode CAE may be disposed on the first interlayer dielectric layer 141. The capacitor electrode CAE may overlap the gate electrode G in the third direction (z-axis direction). Since the first interlayer dielectric layer 141 has a predetermined dielectric constant, a capacitor can be formed by the capacitor electrode CAE, the gate electrode G, and the first interlayer dielectric layer 141 disposed between the capacitor electrode CAE and the gate electrode G. The capacitor electrode CAE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be disposed over the capacitor electrode CAE. The second interlayer dielectric layer 142 may be formed of an inorganic layer, for example, a silicon nitride layer, a silicon oxynitride layer, a silicon oxide layer, a titanium oxide layer, or an aluminum oxide layer. The second interlayer dielectric layer 142 may include a plurality of inorganic layers, and the thickness of the second interlayer dielectric layer 142 in the third direction (z-axis direction) may be larger than the thickness of the first interlayer dielectric layer 141 in the third direction (z-axis direction).

A first anode connection electrode ANDE1 may be disposed on the second interlayer dielectric layer 142. The first anode connection electrode ANDE1 may be connected to the drain electrode D of the thin-film transistor TFT through a first anode contact hole ANCT1 that penetrates the first interlayer dielectric layer 141 and the second interlayer dielectric layer 142 to expose the drain electrode D. The first anode connection electrode ANDE1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first organic layer 160 may be disposed on the first anode connection electrode ANDE1 for planarization. The first organic layer 160 may be formed as an organic layer such as an acryl resin, an epoxy resin, a phenolic resin, a polyamide resin and a polyimide resin.

A second anode connection electrode ANDE2 may be disposed on the first organic layer 160. The second anode connection electrode ANDE2 may be connected to the second anode connection electrode ANDE2 through a second anode contact hole ANCT2 that penetrates through the first organic layer 160 to expose the first anode connection electrode ANDE1. The second anode connection electrode ANDE2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second organic layer 161 may be disposed on the second anode connection electrode ANDE2. The second organic layer 161 may be formed as an organic layer such as an acryl resin, an epoxy resin, a phenolic resin, a polyamide resin and a polyimide resin.

In FIG. 6, the thin-film transistors TFT are implemented as top-gate transistors in which the gate electrode is located above the active layer. It is, however, to be understood that the present disclosure is not limited thereto. The thin-film transistors TFT may be implemented as bottom-gate transistors in which the gate electrode is located below the active layer, or as double-gate transistors in which the gate electrodes are disposed above and below the active layer, respectively.

An emission material layer EML may be disposed on the second organic layer 161. The emission material layer EML may include light-emitting elements LEL and an emission area defining layer 180. Each of the light-emitting elements LEL includes a pixel electrode 171, an emissive layer 172, and a common electrode 173. The common electrode 173 may be commonly connected to the plurality of light-emitting elements LEL.

The pixel electrode 171 may be formed on the second organic layer 161. The pixel electrode 171 may be connected to the second anode connection electrode ANDE2 through a third anode contact hole ANCT3 that penetrates through the second organic layer 161 to expose the second anode connection electrode ANDE2.

In the top-emission structure in which light exits from the emissive layer 172 toward the common electrode 173, the pixel electrode 171 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The emission area defining layer 180 may partition the pixel electrode 171 on the second organic layer 161 to define the emission areas EA1, EA2, EA3 and EA4. The emission area defining layer 180 may be formed to cover the edge of the pixel electrode 171. The emission area defining layer 180 may be formed of an organic layer such as an acryl resin, an epoxy resin, a phenolic resin, a polyamide resin and a polyimide resin.

In each of the emission areas EA1, EA2, EA3 and EA4, the pixel electrode 171, the emissive layer 172 and the common electrode 173 are stacked on one another sequentially, so that holes from the pixel electrode 171 and electrons from the common electrode 173 are combined with each other in the emissive layer 172 to emit light.

The emissive layer 172 is formed on the pixel electrode 171 and the emission area defining layer 180. The emissive layer 172 may include an organic material to emit light of a certain color. For example, the emissive layer 172 may include a hole transporting layer, an organic material layer, and an electron transporting layer.

The common electrode 173 is formed on the emissive layer 172. The common electrode 173 may be formed to cover the emissive layer 172. The common electrode 173 may be a common layer formed across all of the emission areas EA1, EA2, EA3 and EA4. A capping layer may be formed on the common electrode 173.

In the top-emission structure, the common electrode 173 may be formed of a transparent conductive oxide (TCO) such as indium tin oxide (ITO) and indium zinc oxide (IZO) that can transmit light, or a semi-transmissive conductive material such as magnesium (Mg), silver (Ag) and an alloy of magnesium (Mg) and silver (Ag). When the common electrode 173 is formed of a semi-transmissive metal material, the light extraction efficiency can be increased by using microcavities.

An encapsulation layer TFEL may be disposed on the common electrode 173. The encapsulation layer TFEL includes at least one inorganic layer to prevent permeation of oxygen or moisture into the emission material layer EML. In addition, the encapsulation layer TFEL includes at least one organic layer to protect the emission material layer EML from foreign substances such as dust. For example, the encapsulation layer TFEL may include a first inorganic encapsulation layer TFE1, an organic encapsulation layer TFE2 and a second inorganic encapsulation layer TFE3.

The first inorganic encapsulation layer TFE1 may be disposed on the common electrode 173, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may be made up of multiple layers in which one or more inorganic layers of a silicon nitride layer, a silicon oxynitride layer, a silicon oxide layer, a titanium oxide layer and an aluminum oxide layer are alternately stacked on one another. The organic encapsulation layer TFE2 may be formed as an acryl resin, an epoxy resin, a phenolic resin, a polyamide resin, a polyimide resin, etc.

A sensor electrode layer SENL may be disposed on the encapsulation layer TFEL. The sensor electrode layer SENL may include the driving electrodes TE, the sensing electrodes RE, and the bridge portions BEL A first sensor insulating layer TINS1 may be disposed on the second inorganic encapsulation layer TFE3. The first sensor insulating layer TINS1 may be made up of multiple layers in which one or more inorganic layers of a silicon nitride layer, a silicon oxynitride layer, a silicon oxide layer, a titanium oxide layer and an aluminum oxide layer are alternately stacked on one another. Alternatively, the first sensor insulating layer TINS1 may be formed of an organic layer such as an acryl resin, an epoxy resin, a phenolic resin, a polyamide resin and a polyimide resin.

The bridge portions BE1 may be disposed on the first sensor insulating layer TINS1. The bridge portions BE1 may not overlap with the first emission area EA1, the second emission area EA2, the third emission area EA3 and the fourth emission area EA4 in the third direction (z-axis direction). The bridge portions BE1 may overlap with the emission area defining layer 180 in the third direction (z-axis direction). The bridge portions BE1 may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The second sensor insulating layer TINS2 may be disposed on the first bridge portions BE1. The second sensor insulating layer TINS2 may be made up of multiple layers in which one or more inorganic layers of a silicon nitride layer, a silicon oxynitride layer, a silicon oxide layer, a titanium oxide layer and an aluminum oxide layer are alternately stacked on one another. Alternatively, the second sensor insulating layer TINS2 may be formed of an organic layer such as an acryl resin, an epoxy resin, a phenolic resin, a polyamide resin and a polyimide resin.

The driving electrodes TE and the sensing electrodes RE may be disposed on the second sensor insulating layer TINS2. The driving electrodes TE and the sensing electrodes RE may not overlap with the first emission area EA1, the second emission area EA2, the third emission area EA3 and the fourth emission area EA4 in the third direction (z-axis direction). The driving electrodes TE and the sensing electrodes RE may overlap the emission area defining layer 180 in the third direction (z-axis direction). The driving electrodes TE may be connected to the first bridge portions BE1 through the first sensor contact hole TCNT1 penetrating through the second sensor insulating layer TINS2. The driving electrodes TE and the sensing electrodes RE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy, or a stack structure of an APC alloy and ITO (ITO/APC/ITO).

A third sensor insulating layer TINS3 may be disposed on the driving electrodes TE and the sensing electrodes RE. The third sensor insulating layer TINS3 may be formed of an organic layer such as an acryl resin, an epoxy resin, a phenolic resin, a polyamide resin and a polyimide resin.

Figure 7A:
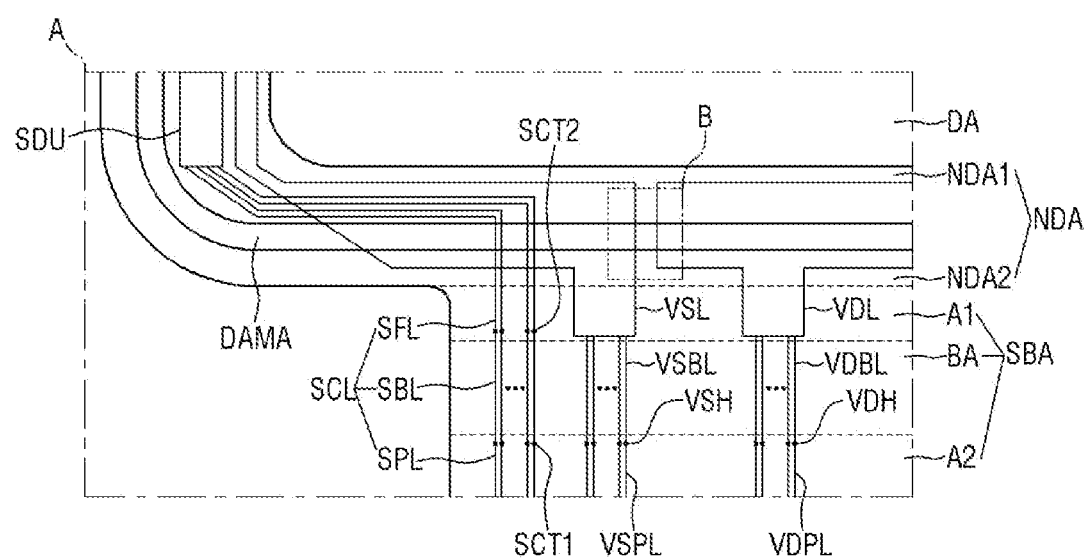
FIG. 7A is a layout diagram showing a non-display area of a display panel according to an embodiment.

FIG. 7A is a layout diagram showing a non-display area of a display panel according to an embodiment. FIG. 7A is a layout diagram showing an example of area A of FIG. 2 in detail.

For convenience of illustration, FIG. 7A shows a scan driving unit SDU, scan control lines SCL, a first voltage supply line VSL, a first voltage supply pad line VSPL, a first voltage supply bending line VSBL, a second voltage supply line VDL, a second voltage supply pad line VDPL, and a second voltage supply bending line VDBL.

Referring to FIG. 7A, the scan driving unit SDU may be disposed on the left side of the display area DA. The scan driving unit SDU may be connected to the display driver circuit 200 through the scan control lines SCL. The scan driving unit SDU may receive a scan timing signal from the display driver circuit 200 through the scan control lines SCL. The scan driving unit SDU may generate scan signals according to the scan timing signal. The scan driving unit SDU may output scan signals to the scan lines GWL, GIL and GCL of the display area DA.

The scan control lines SCL may include a scan fan-out line SFL, a scan pad line SPL, and a scan bending line SBL.

The scan fan-out line SFL may be disposed in the non-display area NDA and in the first area A1 of the subsidiary area SBA. The scan fan-out line SFL may be disposed between the scan driving unit SDU and the scan bending line SBL. One end of the scan fan-out line SFL may be connected to the scan driving unit SDU, and the other end thereof may be connected to the scan bending line SBL through a second scan contact hole SCH2. The scan fan-out line SFL may overlap the dam area DAMA.

The scan bending line SBL may be disposed in the first area A1, the second area A2 and the bending area BA of the subsidiary area SBA. The scan bending line SBL may be disposed between the scan fan-out line SFL and the scan pad line SPL. One end of the scan bending line SBL may be connected to the scan fan-out line SFL through the second scan contact hole SCH2 in the first area A1, and the other end thereof may be connected to the scan pad line SPL in the second area A2 through a first scan contact hole SCT1.

The scan pad line SPL may be disposed in the second area A2. The scan pad line SPL may be disposed between the scan bending line SBL and the display driver circuit 200. One end of the scan pad line SPL may be connected to the scan bending line SBL through the first scan contact hole SCT1, and the other end thereof may be connected to the display driver circuit 200.

Although data connection lines disposed between the data lines DL of the display area DA and the display driver circuit 200 are not depicted in FIG. 7A for convenience of illustration, the data connection lines may be similar to the scan control lines SCL. The data lines DL may receive data voltages from the display driver circuit 200 through the data connection lines. Each of the data connection lines may include a data fan-out line, a data pad line, and a data bending line. The data fan-out line may be substantially identical to the scan fan-out line SFL, the data pad line may be substantially identical to the scan pad line SPL, and the data bending line may be substantially identical to the scan bending line SBL.

In addition, although the touch lines TL (see FIGS. 10 and 11) are not depicted in FIG. 7A for convenience of illustration, each of the touch lines TL (see FIGS. 10 and 11) may be connected to the respective one of the touch bending lines disposed in the bending area BA.

The first voltage supply line VSL may be disposed in the non-display area NDA. The first voltage supply line VSL may overlap the dam area DAMA. The first voltage supply line VSL may overlap the scan fan-out lines SFL. The first voltage supply line VSL may be disposed between the scan driving unit SDU and the display area DA. Alternatively, the first voltage supply line VSL may overlap the scan driving unit SDU.

The first voltage supply bending lines VSBL may be disposed in the first area A1, the second area A2 and the bending area BA of the subsidiary area SBA. Each of the first voltage supply bending lines VSBL may be disposed between the first voltage supply line VSL and the respective first voltage supply pad line VSPL. The first voltage supply bending lines VSBL may be extended from the first voltage supply line VSL. The first voltage supply bending lines VSBL may be formed integrally with the first voltage supply line VSL. That is to say, the first voltage supply bending lines VSBL may be made of the same material as the first voltage supply line VSL. Each of the first voltage supply bending lines VSBL may be connected to the respective first voltage supply pad line VSPL through a first voltage supply contact hole VSH.

The first voltage supply pad lines VSPL may be disposed in the second area A2. Each of the first voltage supply pad lines VSPL may be disposed between the respective first voltage supply bending line VSBL and the display driver circuit 200. One end of each of the first voltage supply pad lines VSPL may be connected to the respective first voltage supply bending line VSBL through the respective first voltage supply contact hole VSH, and the other end thereof may be connected to the display driver circuit 200.

The second voltage supply line VDL may be disposed in the non-display area NDA. The second voltage supply line VDL may overlap the dam area DAMA. The second voltage supply line VDL may overlap data connection lines (not shown).

The second voltage supply bending lines VDBL may be disposed in the first area A1, the second area A2 and the bending area BA of the subsidiary area SBA. Each of the second voltage supply bending lines VDBL may be disposed between the second voltage supply line VDL and the respective second voltage supply pad line VDPL. The second voltage supply bending lines VDBL may be extended from the second voltage supply line VDL. The second voltage supply bending lines VDBL may be formed integrally with the second voltage supply line VDL. That is to say, the second voltage supply bending lines VDBL may be made of the same material as the second voltage supply line VDL. Each of the second voltage supply bending lines VDBL may be connected to the respective second voltage supply pad line VDPL through a second voltage supply contact hole VDH.

The second voltage supply pad lines VDPL may be disposed in the second area A2. Each of the second voltage supply pad lines VDPL may be disposed between the respective second voltage supply bending line VDBL and the display driver circuit 200. One end of each of the second voltage supply pad lines VDPL may be connected to the respective second voltage supply bending line VDBL through the respective second voltage supply contact hole VDH, and the other end thereof may be connected to the display driver circuit 200.

Figure 7B:
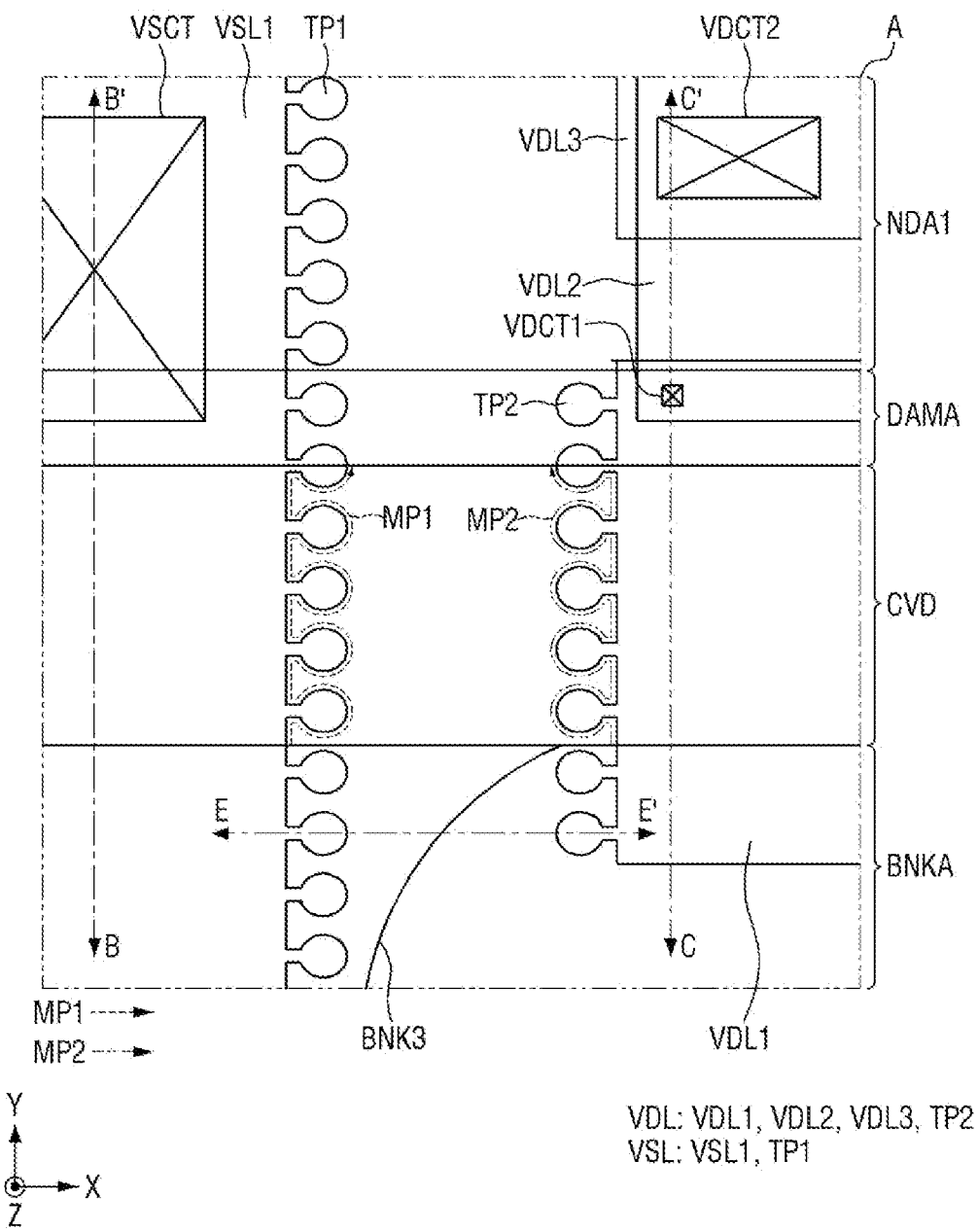
FIG. 7B is a layout diagram showing in detail a dam area, an inorganic encapsulation area, and a bank area according to an embodiment.
Figure 8:
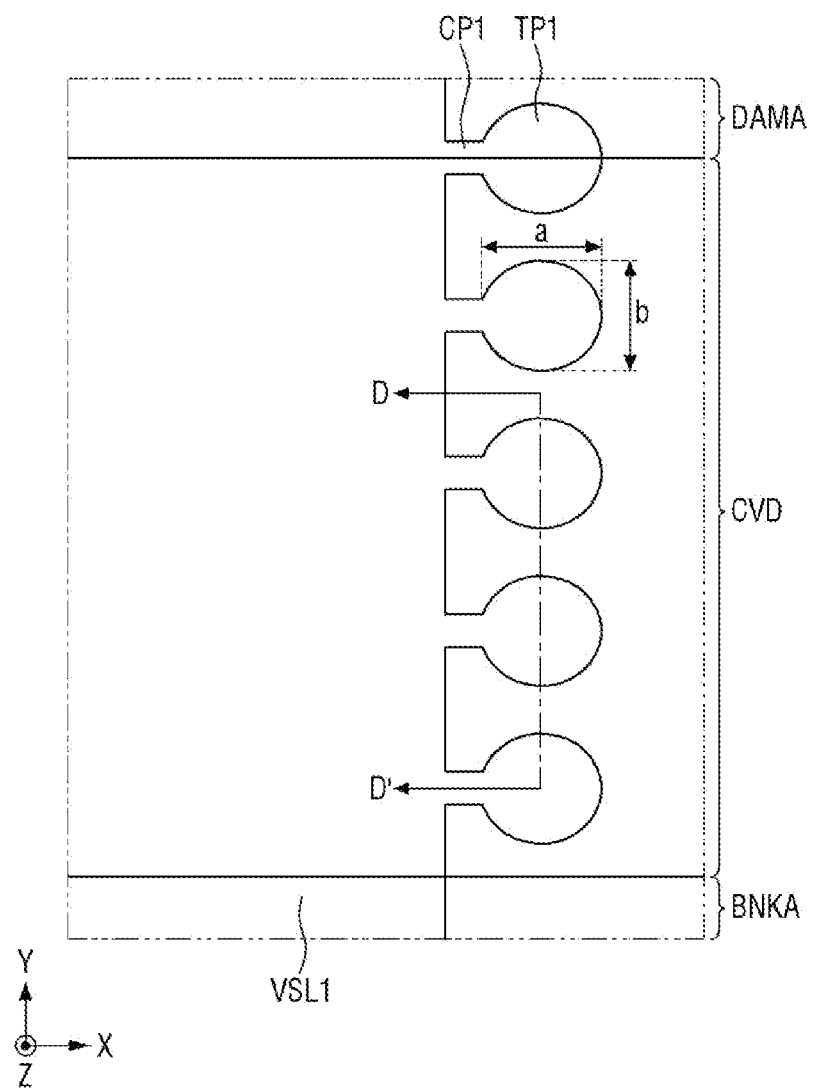
FIG. 8 is a layout diagram showing the first voltage supply line in the inorganic encapsulation area of FIG. 7B.
Figure 9:
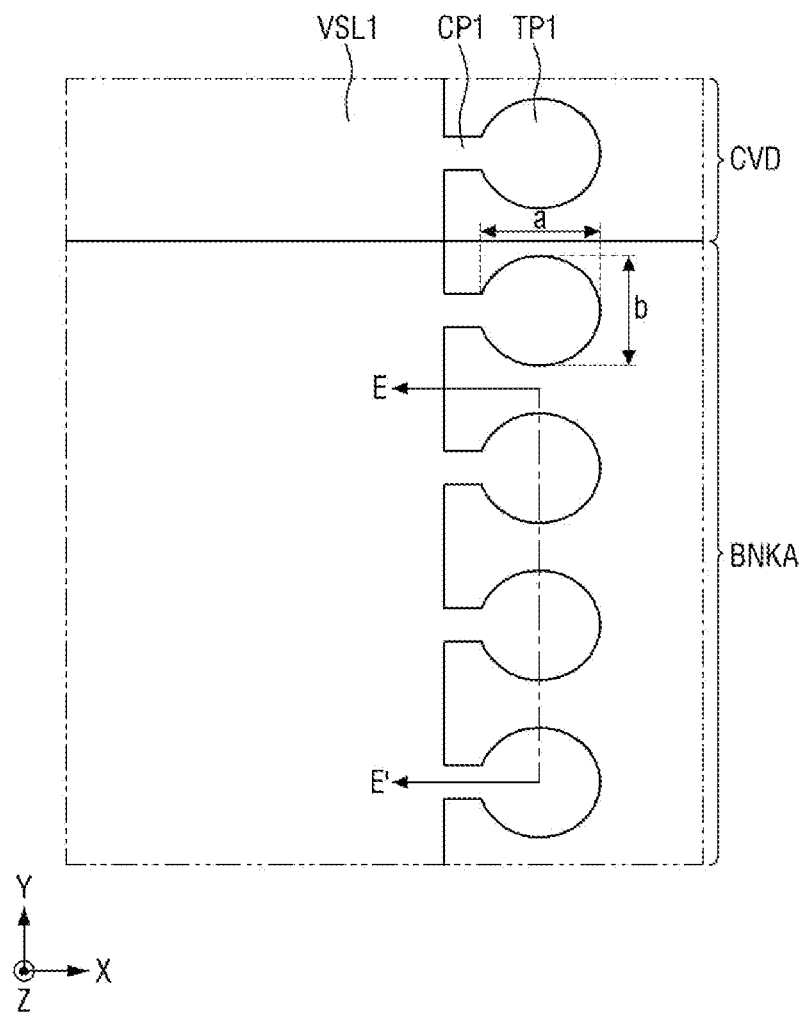
FIG. 9 is a layout diagram showing the first voltage supply line in the bank area of FIG. 7B.

FIG. 7B is a layout diagram showing in detail a dam area, an inorganic encapsulation area, and a bank area according to an embodiment. FIG. 8 is a layout diagram showing the first voltage supply line in the inorganic encapsulation area of FIG. 7B. FIG. 9 is a layout diagram showing the first voltage supply line in the bank area of FIG. 7B. FIG. 7B is an enlarged layout diagram showing in detail area B of FIG. 7A.

Referring to FIGS. 7B, 8 and 9, the non-display area NDA may include the first non-display area NDA1, the dam area DAMA, an inorganic encapsulation area CVD, and a bank area BNKA.

In the dam area DAMA, a dam DAM (see FIG. 10) for preventing overflow of an organic encapsulation layer TFE2 of an encapsulation layer TFEL (see FIG. 6) for encapsulating the light-emitting elements in the display area DA may be disposed. The dam area DAMA may be extended in the first direction (x-axis direction) in the non-display area NDA disposed on the lower side of the display area DA. The dam DAM (see FIG. 10) will be described in detail later with reference to FIG. 10.

In the bank area BNKA, a bank BNK (see FIG. 10) for supporting a mask may be disposed during the process of fabricating the display panel 100. The bank area BNKA may be extended in the first direction (x-axis direction) in the non-display area NDA disposed on the lower side of the display area DA. The bank BNK (see FIG. 10) will be described in detail later with reference to FIG. 10.

The first non-display area NDA1 may refer to a part of the non-display area NDA between the dam area DAMA and the display area DA, as shown in FIG. 2. The first non-display area NDA1 may be disposed on the inner side of the dam area DAMA, and the second non-display area NDA2 may be disposed on the outer side of the dam area DAMA.

The inorganic encapsulation area CVD may be disposed between the dam area DAMA and the bank area BNKA. In inorganic encapsulation area CVD, the first inorganic encapsulation layer TFE1 and the second inorganic encapsulation layer TFE2 of the encapsulation layer TFEL (see FIG. 6) for encapsulating the display panel 100 may be in contact with each other. In the inorganic encapsulation area CVD, only inorganic layers may be disposed but no organic layer may be disposed. The inorganic encapsulation area CVD may be extended in the first direction (x-axis direction) in the non-display area NDA disposed on the lower side of the display area DA.

In the non-display area NDA, the first voltage supply line VSL for supplying the first supply voltage to the common electrode 173 (see FIG. 6) may be disposed. The first voltage supply line VSL may include a first subsidiary voltage supply line VSL1, a second subsidiary voltage supply line VSL2 (see FIG. 10), and a plurality of first anti-moisture patterns TP1. Since the second subsidiary voltage supply line VSL2 (see FIG. 10) is disposed under the first subsidiary voltage supply line VSL1, the second subsidiary voltage supply line VSL2 (see FIG. 10) is not shown in FIG. 7B.

The first subsidiary voltage supply line VSL1 may be extended in the second direction (y-axis direction). The first subsidiary voltage supply line VSL1 may be disposed in the first non-display area NDA1, the dam area DAMA, the inorganic encapsulation area CVD, and the bank area BNKA. The first subsidiary voltage supply line VSL1 may be connected to the second subsidiary voltage supply line VSL2 through a first voltage supply contact hole VSCT1. Accordingly, since the resistance of the first voltage supply line VSL may be lowered, the first supply voltage can be applied more uniformly regardless of the positions of the emission areas EA1, EA2, EA3 and EA4 in FIG. 5C disposed in the display area DA.

In the inorganic encapsulation area CVD, the first subsidiary voltage supply line VSL1 may not be properly covered by the first inorganic encapsulation layer TFE1 or the second inorganic encapsulation layer TFE2, due to the slope of the side surfaces of the first subsidiary voltage supply line VSL1. Specifically, in the inorganic encapsulation area CVD, an air gap OP (see FIG. 12C) may be created in the first inorganic encapsulation layer TFE1 and the second inorganic encapsulation layer TFE2 due to the slope of the side surfaces of the first subsidiary voltage supply line VSL1. The air gap OP (see FIG. 12C) may be a path through which air or moisture may permeate from the outside.

The plurality of first anti-moisture patterns TP1 may protrude from one side of the first subsidiary voltage supply line VSL1 in the first direction (x-axis direction). The plurality of first anti-moisture patterns TP1 may be arranged in the second direction (y-axis direction).

In the inorganic encapsulation area CVD, the air gap OP (see FIG. 12C) may be formed along the side surface of the first subsidiary voltage supply line VSL1. Therefore, in the inorganic encapsulation area CVD, a path MP1 through which air or moisture permeate from the outside through the air gap OP (see FIG. 12C) may be formed along the side surface of the first subsidiary voltage supply line VSL1. When the first voltage supply line VSL includes a plurality of first anti-moisture patterns TP1, the length of the side surface of the first voltage supply line VSL may include the sum of the lengths of the circumference of the plurality of first anti-moisture patterns TP1. Therefore, when the first voltage supply line VSL includes the plurality of first anti-moisture patterns TP1, the length of the side surface of the first voltage supply line VSL can become longer compared to the first voltage supply line VSL without the plurality of first anti-moisture patterns TP1. Accordingly, the path MP1 of outside air or moisture through the air gap OP (see FIG. 12C) may become longer by virtue of the plurality of first anti-moisture patterns TP1. As a result, it is possible to delay or prevent the permeation of outside air or moisture by virtue of the plurality of first anti-moisture patterns TP1. Therefore, even though the width of the inorganic encapsulation area is reduced, it is possible to prevent the organic light-emitting elements of the emission areas adjacent to the inorganic encapsulation area from being damaged by air or moisture.

The plurality of first anti-moisture patterns TP1 may be disposed in the inorganic encapsulation area CVD. In addition, although the plurality of first anti-moisture patterns TP1 may be disposed in the first non-display area NDA1, the dam area DAMA and the bank area BNKA, the embodiments described herein are not limited thereto. The plurality of first anti-moisture patterns TP1 may be eliminated in at least one of the first non-display area NDA1, the dam area DAMA and the bank area BNKA.

Although each of the plurality of first anti-moisture patterns TP1 has an elliptical shape when viewed from the top as shown in FIG. 8, embodiments described herein are not limited thereto. Each of the plurality of first anti-moisture patterns TP1 may have a circular shape or a polygonal shape such as a triangle and a square when viewed from the top.

As the length (a) in the first direction (x-axis direction) and the length (b) in the second direction (y-axis direction) of each of the plurality of first anti-moisture patterns TP1 increase, the circumference of each of the plurality of first anti-moisture patterns TP1 may become longer. Recently, in order to widen the display area DA, the non-display area NDA is reduced. Accordingly, the width of the inorganic encapsulation area CVD is reduced. Although the number of first anti-moisture patterns TP1 decreases as the width of the inorganic encapsulation area CVD is reduced, when the length (a) in the first direction (x-axis direction) and/or the length (b) in the second direction (y-axis direction) of each of the plurality of first anti-moisture patterns TP1 are increased, the path MP1 of the outside air or moisture through the air gap OP (see FIG. 12C) in the inorganic encapsulation area CVD may not be reduced. According to experiments conducted by the inventors of the application, it was possible to delay or prevent the permeation of outside air or moisture if the path MP1 of outside air or moisture through the air gap OP (see FIG. 12C) in the inorganic encapsulation area CVD is 540 μm or more.

Table 1 shows the width of the inorganic encapsulation area CVD, the number of the first anti-moisture patterns TP1, the length (a) in the first direction (x-axis direction) and the length (b) in the second direction (y-axis direction) of the first anti-moisture patterns TP1, the circumference of the first anti-moisture patterns TP1, and the total perimeter of the plurality of first anti-moisture patterns TP1 in the inorganic encapsulation area CVD.

TABLE 1

| | 1 | 2 | 3 | 4 | 5 |
|---|---|---|---|---|---|
| Width of inorganic encapsulation area CVD | 125 μm | 88 μm | 50 μm | 50 μm | 25 μm |
| Number (n) of the first anti-moisture patterns TP1 | 5 | 3.5 | 2 | 2 | 1 |
| Length (a) in the first direction (x-axis direction) of the first anti-moisture patterns TP1 | 25 μm | 25 μm | 25 μm | 63 μm | 150 μm |
| Length (b) in the second direction (y-axis direction) of the first anti-moisture patterns TP1 | 25 μm | 25 μm | 25 μm | 25 μm | 25 μm |
| Perimeter (s) of each of the first anti-moisture patterns TP1 | 157 μm | 157 μm | 157 μm | 276.3 μm | 549.5 μm |
| The total perimeter of the plurality of first anti-moisture patterns TP1 in the inorganic encapsulation area CVD | 785 μm | 549.5 μm | 314 μm | 552.6 μm | 549.5 μm |

In Table 1, the circumference of the first anti-moisture pattern TP1 may be defined as "π×(a+b)", and the total perimeter of the plurality of first anti-moisture patterns TP1 in the inorganic encapsulation area CVD may be defined as "s×n".

Referring to Table 1, when the width of the inorganic encapsulation area CVD is 125 μm, and five first anti-moisture patterns TP1 having the length (a) in the first direction (x-axis direction) of 25 μm and the length (b) in the second direction (y-axis direction) of 25 μm are disposed, the total perimeter of the plurality of first anti-moisture patterns TP1 in the inorganic encapsulation area CVD may be approximately 785 μm. In this case, it is possible to delay or prevent the permeation of outside air or moisture because the path MP1 of outside air or moisture through the air gap OP (see FIG. 12C) in the inorganic encapsulation area CVD is equal to or greater than 540 μm.

When the width of the inorganic encapsulation area CVD is 88 μm, and three and half first anti-moisture patterns TP1 having the length (a) in the first direction (x-axis direction) of 25 μm and the length (b) in the second direction (y-axis direction) of 25 μm are disposed, the total perimeter of the plurality of first anti-moisture patterns TP1 in the inorganic encapsulation area CVD may be approximately 549.5 μm. In this case, it is possible to delay or prevent the permeation of outside air or moisture because the path MP1 of outside air or moisture through the air gap OP (see FIG. 12C) in the inorganic encapsulation area CVD is equal to or greater than 540 μm.

When the width of the inorganic encapsulation area CVD is 50 μm, and two first anti-moisture patterns TP1 having the length (a) in the first direction (x-axis direction) of 25 μm and the length (b) in the second direction (y-axis direction) of 25 μm are disposed, the total perimeter of the plurality of first anti-moisture patterns TP1 in the inorganic encapsulation area CVD may be approximately 314 μm. In this case, it is difficult to delay or prevent the permeation of outside air or moisture because the path MP1 of outside air or moisture through the air gap OP (see FIG. 12C) in the inorganic encapsulation area CVD is less than 540 μm. Therefore, if the width of the inorganic encapsulation area CVD is 50 μm, it is necessary to increase the length (a) in the first direction (x-axis direction) or the length (b) in the second direction (y-axis direction).

When the width of the inorganic encapsulation area CVD is 50 μm, and two first anti-moisture patterns TP1 having the length (a) in the first direction (x-axis direction) of 63 μm and the length (b) in the second direction (y-axis direction) of 25 μm are disposed, the total perimeter of the plurality of first anti-moisture patterns TP1 in the inorganic encapsulation area CVD may be approximately 552.6 μm. In this case, it is possible to delay or prevent the permeation of outside air or moisture because the path MP1 of outside air or moisture through the air gap OP (see FIG. 12C) in the inorganic encapsulation area CVD is equal to or greater than 540 μm.

When the width of the inorganic encapsulation area CVD is 25 μm, and one first anti-moisture pattern TP1 having the length (a) in the first direction (x-axis direction) of 150 μm and the length (b) in the second direction (y-axis direction) of 25 μm is disposed, the total perimeter of the plurality of first anti-moisture patterns TP1 in the inorganic encapsulation area CVD may be approximately 549.5 μm. In this case, it is possible to delay or prevent the permeation of outside air or moisture because the path MP1 of outside air or moisture through the air gap OP (see FIG. 12C) in the inorganic encapsulation area CVD is equal to or greater than 540 μm.

As can be seen from Table 1, even though the width of the inorganic encapsulation area CVD is reduced, it is possible to control the total perimeter of the plurality of first anti-moisture patterns TP1 in the inorganic encapsulation area CVD by adjusting the number of the first anti-moisture patterns TP1 and the length (a) in the first direction (x-axis direction) and the length (b) in the second direction (y-axis direction) of the first anti-moisture patterns TP1. For example, although the number of first anti-moisture patterns TP1 decreases as the width of the inorganic encapsulation area CVD is reduced, by increasing the length (a) in the first direction (x-axis direction) and/or the length (b) in the second direction (y-axis direction) of each of the plurality of first anti-moisture patterns TP1, the path MP1 of the outside air or moisture through the air gap OP (see FIG. 12C) in the inorganic encapsulation area CVD may be equal to or greater than 540 μm. Therefore, it is possible to delay or prevent the permeation of outside air or moisture by virtue of the plurality of first anti-moisture patterns TP1. Therefore, even though the width of the inorganic encapsulation area is reduced, it is possible to prevent the organic light-emitting elements of the emission areas adjacent to the inorganic encapsulation area from being damaged by air or moisture.

The plurality of first anti-moisture patterns TP1 may be connected to the first subsidiary voltage supply line VSL1 by first connection patterns CP1, respectively, as shown in FIG. 8. The first connection patterns CP1 may be disposed between the first anti-moisture patterns TP1 and the first subsidiary voltage supply line VSL1. The first subsidiary voltage supply line VSL1, the plurality of first connection patterns CP1 and the plurality of first anti-moisture patterns TP1 may be integrally formed.

A plurality of first anti-moisture patterns TP1 disposed in the bank area BNKA shown in FIG. 9 is substantially identical to the plurality of first anti-moisture patterns TP1 disposed in the inorganic encapsulation area CVD shown in FIG. 8; and, therefore, the plurality of first anti-moisture patterns TP1 disposed in the bank area BNKA shown in FIG. 9 will not be described.

The second voltage supply line VDL may be spaced apart from the first voltage supply line VSL. The second voltage supply line VDL may supply the second supply voltage having a higher level than the level of the first supply voltage to the display area DA. The second voltage supply line VDL may include a third subsidiary voltage supply line VDL1, a fourth subsidiary voltage supply line VDL2, a fifth subsidiary voltage supply line VDL3, and a plurality of second anti-moisture patterns TP2.

The third subsidiary voltage supply line VDL1 and the fourth subsidiary voltage supply line VDL2 may be disposed in the second direction (y-axis direction). The third subsidiary voltage supply line VDL1 may be disposed in the dam area DAMA, the inorganic encapsulation area CVD, and the bank area BNKA. The fourth subsidiary voltage supply line VDL2 may be disposed in the first non-display area NDA1 and the dam area DAMA. The third subsidiary voltage supply line VDL1 may be connected to the fourth subsidiary voltage supply line VDL2 through a second voltage supply contact hole VDCT1.

The fifth subsidiary voltage supply line VDL3 may be disposed in the first non-display area NDA1. The fifth subsidiary voltage supply line VDL3 may be connected to the fourth subsidiary voltage supply line VDL2 through a third voltage supply contact hole VDCT2. Accordingly, since the resistance of the second voltage supply line VDL may be lowered, the second supply voltage can be applied more uniformly regardless of the positions of the emission areas EA1, EA2, EA3 and EA4 in FIG. 5C disposed in the display area DA.

In the inorganic encapsulation area CVD, the third subsidiary voltage supply line VDL1 may not be properly covered by the first inorganic encapsulation layer TFE1 or the second inorganic encapsulation layer TFE2, due to the slope of the side surfaces of the third subsidiary voltage supply line VDL1. Specifically, in the inorganic encapsulation area CVD, an air gap OP may be created in the first inorganic encapsulation layer TFE1 and the second inorganic encapsulation layer TFE2 due to the slope of the side surfaces of the third subsidiary voltage supply line VDL1. The air gap may work as a path through which air or moisture permeates from the outside.

The plurality of second anti-moisture patterns TP2 may protrude from one side of the third voltage supply line VDL1 in the first direction (x-axis direction). The plurality of second anti-moisture patterns TP2 may be arranged in the second direction (y-axis direction). The plurality of second anti-moisture patterns TP2 may face the plurality of first anti-moisture patterns TP1.

In the inorganic encapsulation area CVD, an air gap may be created along a side surface of the third subsidiary voltage supply line VDL1. Therefore, in the inorganic encapsulation area CVD, a path MP2 through which air or moisture permeate from the outside through the air gap may be formed along the side surface of the third subsidiary voltage supply line VDL1. When the second voltage supply line VDL includes a plurality of second anti-moisture patterns TP2, the length of the side surface of the second voltage supply line VDL may include the sum of the lengths of the circumference of the plurality of second anti-moisture patterns TP2. Therefore, when the second voltage supply line VDL includes the plurality of second anti-moisture patterns TP2, the length of the side surface of the second voltage supply line VDL can become longer compared to the second voltage supply line VDL without the plurality of second anti-moisture patterns TP2. Accordingly, due to the plurality of second anti-moisture patterns TP2, the path MP2 through which air or moisture permeates from the outside through the air gap may become longer. As a result, it is possible to delay or prevent the permeation of external air or moisture by virtue of the plurality of second anti-moisture patterns TP2.

The plurality of second anti-moisture patterns TP2 may be disposed in the inorganic encapsulation area CVD. In addition, although the plurality of second anti-moisture patterns TP2 may be disposed in the dam area DAMA and the bank area BNKA, the embodiments described herein are not limited thereto. The plurality of second anti-moisture patterns TP2 may be eliminated in at least one of the dam area DAMA and the bank area BNKA.

As shown in FIGS. 7B, 8 and 9, in the inorganic encapsulation area CVD, the first voltage supply line VSL includes the plurality of first anti-moisture patterns TP1, and the second voltage supply line VDL includes the plurality of second anti-moisture patterns TP2. Therefore, even if an air gap is created along the side surface of the first voltage supply line VSL in the inorganic encapsulation area CVD, the path MP1 through which air or moisture permeates from the outside through the air gap may become longer. In addition, even if an air gap is created along the side surface of the second voltage supply line VDL in the inorganic encapsulation area CVD, the path MP2 through which air or moisture permeates from the outside through the air gap may become longer. As a result, it is possible to delay or prevent the permeation of outside air or moisture by virtue of the plurality of first anti-moisture patterns TP1 and the plurality of second anti-moisture patterns TP2.

In addition, it is possible to control the total perimeter of the plurality of first anti-moisture patterns TP1 in the inorganic encapsulation area CVD by adjusting the number of the first anti-moisture patterns TP1 and the length (a) in the first direction (x-axis direction) and the length (b) in the second direction (y-axis direction) of the first anti-moisture patterns TP1. For example, although the number of first anti-moisture patterns TP1 decreases as the width of the inorganic encapsulation area CVD is reduced, by increasing the length (a) in the first direction (x-axis direction) and/or the length (b) in the second direction (y-axis direction) of each of the plurality of first anti-moisture patterns TP1, the path MP1 of the outside air or moisture through the air gap OP (see FIG. 12C) in the inorganic encapsulation area CVD can be maintained at 540 µm or more. Therefore, even though the width of the inorganic encapsulation area CVD is to reduced as the display area DA is expanded while the non-display area NDA is reduced, it is possible to delay or prevent the permeation of outside air or moisture by virtue of the plurality of first anti-moisture patterns TP1. Therefore, even though the width of the inorganic encapsulation area is reduced, it is possible to prevent the organic light-emitting elements of the emission areas adjacent to the inorganic encapsulation area from being damaged by air or moisture.

Figure 10:
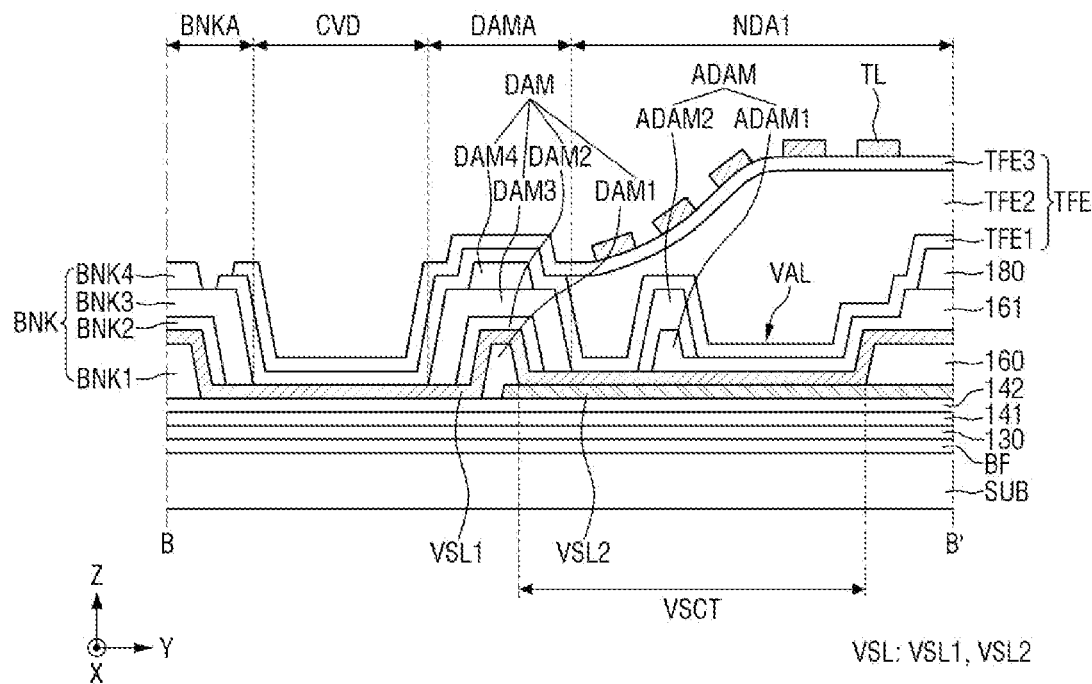
FIG. 10 is a cross-sectional view showing an example of the display panel, taken along line B-B' of FIG. 7B.

FIG. 10 is a cross-sectional view showing an example of the display panel, taken along line B-B' of FIG. 7B.

Referring to FIG. 10, the first voltage supply line VSL may include the first subsidiary voltage supply line VSL1 and the second subsidiary voltage supply line VSL2. The dam DAM may include a first subsidiary dam DAM1, a second subsidiary dam DAM2, a third subsidiary dam DAM3, and a fourth subsidiary dam DAM4. The dam DAM may be disposed in the dam area DAMA. Although one dam DAM is disposed in the dam area DAMA in the example shown in FIG. 10, the present disclosure is not limited thereto. A plurality of dams DAM may be disposed in the dam area DAMA. A valley structure ADAM is a structure for forming a valley VAL between the valley structure ADAM and the first organic layer 160 and may be disposed in the first non-display area NDA1. The valley structure ADAM may include a first valley structure ADAM1 and a second valley structure ADAM2. The bank BNK may include a first subsidiary bank BNK1, a second subsidiary bank BNK2, a third subsidiary bank BNK3, and a fourth subsidiary bank BNK4.

The second subsidiary voltage supply line VSL2 may be disposed on the second interlayer dielectric layer 142. The second subsidiary voltage supply line VSL2 may be disposed in the first non-display area NDA1 and the dam area DAMA. The second subsidiary voltage supply line VSL2 may overlap the dam DAM and the valley structure ADAM in the third direction (z-axis direction). The second subsidiary voltage supply line VSL2 may be made of the same material as the first anode connection electrode ANDE1 and may be disposed on the same layer.

The first subsidiary dam DAM1 may be disposed on the second subsidiary voltage supply line VSL2. The first subsidiary bank BNK1 may be disposed on the interlayer dielectric layer 142. The first subsidiary dam DAM1 and the first subsidiary bank BNK1 may be made of the same material as the first organic layer 160 and may be disposed on the same layer.

The first subsidiary voltage supply line VSL1 may be disposed on the first organic layer 160, the first subsidiary dam DAM1 and the first subsidiary bank BNK1. The first subsidiary voltage supply line VSL1 may be connected to the second subsidiary voltage supply line VSL2 through a first voltage supply contact hole VSCT. The first voltage supply contact hole VSCT may be located in the dam area DAMA and the first non-display area NDA1. The first subsidiary voltage supply line VSL1 may be made of the same material as the second anode connection electrode ANDE2 and may be disposed on the same layer.

The second organic layer 161, the second subsidiary dam DAM2, the first valley structure ADAM1 and the second subsidiary bank BNK2 may be disposed on the first subsidiary voltage supply line VSL1. The second subsidiary dam DAM2, the first valley structure ADAM1 and the second subsidiary bank BNK2 may be made of the same material as the second organic layer 161 and may be disposed on the same layer.

The thickness of the second subsidiary dam DAM2 and the thickness of the second subsidiary bank BNK2 may be smaller than the thickness of the first valley structure ADAM1 and the second organic layer 161. The first valley structure ADAM1 and the second organic layer 161 may be connected with each other. The thickness of the connection portion connecting between the first valley structure ADAM1 and the second organic layer 161 may be smaller than the thickness of the first valley structure ADAM1 and the second organic layer 161.

The third subsidiary dam DAM3 may be disposed on the second subsidiary dam DAM2, the second valley structure ADAM2 may be disposed on the first valley structure ADAM1, and the third subsidiary bank BNK3 may be disposed on the second subsidiary bank BNK2. The third subsidiary dam DAM3, the second valley structure ADAM2 and the third subsidiary bank BNK3 may be made of the same material as the emission area defining layer 180 and may be disposed on the same layer.

The third subsidiary dam DAM3 may cover the second subsidiary dam DAM2. For example, the third subsidiary dam DAM3 may be disposed on the upper and side surfaces of the second subsidiary dam DAM2. In addition, the second valley structure ADAM2 may cover the first valley structure ADAM1. For example, the second valley structure ADAM2 may be disposed on the upper and side surfaces of the first valley structure ADAM1. In addition, the third subsidiary bank BNK3 may cover the second subsidiary bank BNK2. For example, the third subsidiary bank BNK3 may be disposed on the upper and side surfaces of the second subsidiary bank BNK2.

The fourth subsidiary dam DAM4 may be disposed on the third subsidiary dam DAM3, and the fourth subsidiary bank BNK4 may be disposed on the third subsidiary bank BNK3. The fourth subsidiary dam DAM4 and the fourth subsidiary bank BNK4 may be made of the same material and may be disposed on the same layer. The fourth subsidiary dam DAM4 and the fourth subsidiary bank BNK4 may be structures for supporting a mask during the process of fabricating the display panel 100. Thanks to the fourth subsidiary dam DAM4 and the fourth subsidiary bank BNK4, the mask can be stably supported without sagging. The fourth subsidiary dam DAM4 may be eliminated.

The first inorganic encapsulation layer TFE1 may be disposed in the first non-display area NDA1, the dam area DAMA, the inorganic encapsulation area CVD, and the bank area BNKA. The first inorganic encapsulation layer TFE1 may be disposed on the emission area defining layer 180, the valley structure ADAM, the dam DAM, the first subsidiary voltage supply line VSL1, and the bank BNK. The organic encapsulation layer TFE2 may be disposed in the first non-display area NDA1 and the dam area DAMA. Since the organic encapsulation layer TFE2 cannot flow over the dam DAM and the valley structure ADAM, the first inorganic encapsulation layer TFE1 and the second inorganic encapsulation layer TFE3 may be in contact with each other in the inorganic encapsulation area CVD. As a result, an inorganic encapsulation structure may be formed in the inorganic encapsulation area CVD. The second inorganic encapsulation layer TFE3 may be disposed in the first non-display area NDA1, the dam area DAMA, the inorganic encapsulation area CVD, and the bank area BNKA.

Figure 11:
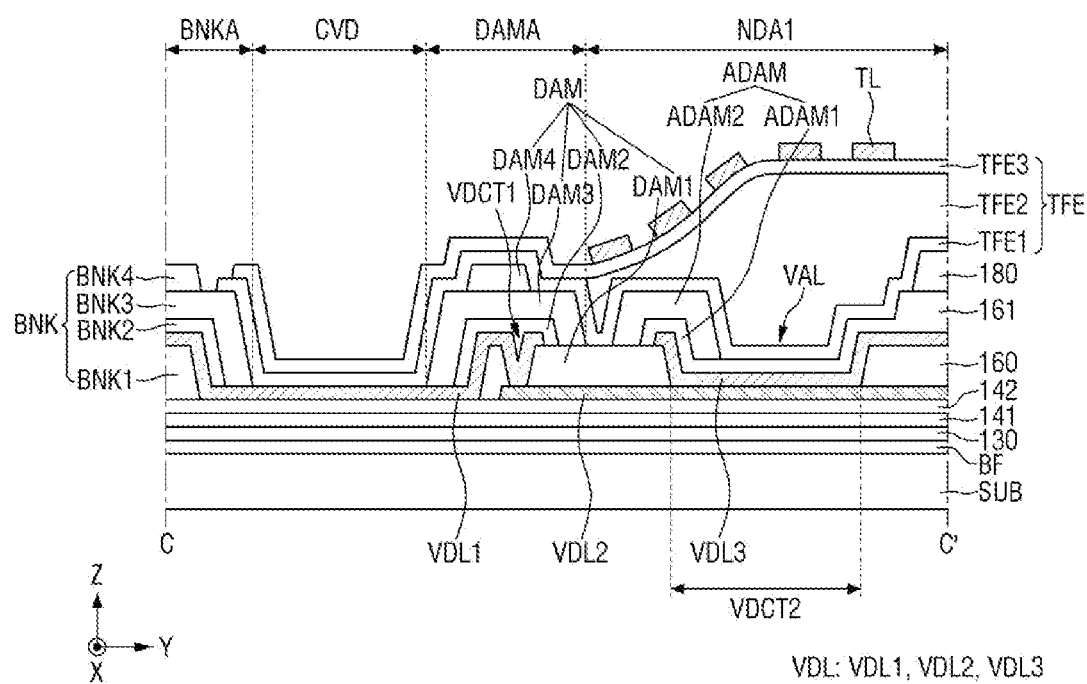
FIG. 11 is a cross-sectional view showing an example of the display panel, taken along line C-C' of FIG. 7B.

FIG. 11 is a cross-sectional view showing an example of the display panel, taken along line C-C' of FIG. 7B.

Referring to FIG. 11, the second voltage supply line VDL may include the third subsidiary voltage supply line VDL1, the fourth subsidiary voltage supply line VDL2, and the fifth subsidiary voltage supply line VDL3.

The fourth subsidiary voltage supply line VDL2 may be disposed on the second interlayer dielectric layer 142. The fourth subsidiary voltage supply line VDL2 may be disposed in the first non-display area NDA1 and the dam area DAMA. The fourth subsidiary voltage supply line VDL2 may overlap the dam DAM and the valley structure ADAM in the third direction (z-axis direction). The fourth subsidiary voltage supply line VDL2 may be made of the same material as the second subsidiary voltage supply line VSL2 and may be disposed on the same layer.

The third subsidiary voltage supply line VDL1 may be disposed on the first subsidiary dam DAM1 and the first subsidiary bank BNK1. The third subsidiary voltage supply line VDL1 may be connected to the fourth subsidiary voltage supply line VDL2 through a second voltage supply contact hole VDCT1. The second voltage supply contact hole VDCT1 may be located in the dam area DAMA.

The fifth subsidiary voltage supply line VDL3 may be disposed on the first subsidiary dam DAM1 and the first organic layer 160. The fifth subsidiary voltage supply line VDL3 may be connected to the fourth subsidiary voltage supply line VDL2 through a third voltage supply contact hole VDCT2. The third voltage supply contact hole VDCT2 may be located in the first non-display area NDA1.

The third subsidiary voltage supply line VDL1 and the fifth subsidiary voltage supply line VDL3 may be made of the same material as the first subsidiary voltage supply line VSL1 and may be disposed on the same layer.

The second subsidiary dam DAM2 and the second subsidiary bank BNK2 may be disposed on the third subsidiary voltage supply line VDL1. The first valley structure ADAM1 and the second organic layer 161 may be disposed on the fifth subsidiary voltage supply line VDL3.

Besides, the dam DAM, the valley structure ADAM, the bank BNK and the encapsulation layer TFEL are substantially identical to those described above with reference to FIG. 11; and, therefore, the redundant descriptions will be omitted.

Figure 12A:
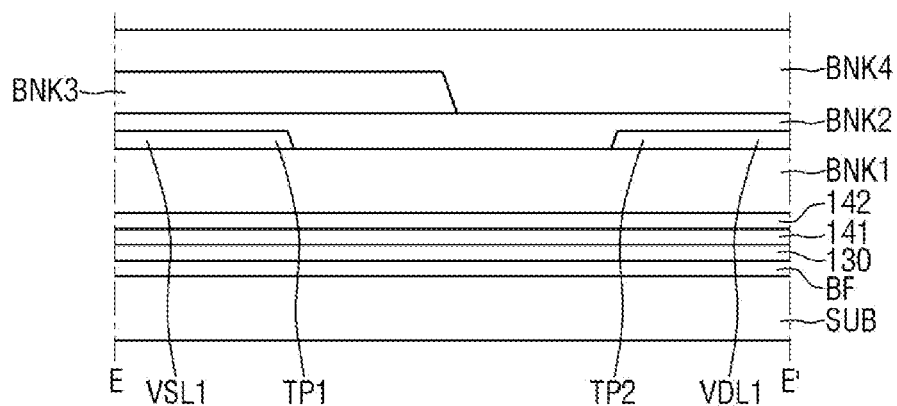
FIG. 12A is a cross-sectional view showing an example of the display panel, taken along line E-E' of FIG. 7B.

FIG. 12A is a cross-sectional view showing an example of the display panel, taken along line E-E' of FIG. 7B.

Referring to FIG. 12A, the third subsidiary bank BNK3 may be eliminated in a part of the bank area BNKA. For example, in the bank area BNKA, the first subsidiary voltage supply line VSL1 of the first voltage supply line VSL may overlap the third subsidiary bank BNK3, while the third subsidiary voltage supply line VDL1 of the second voltage supply line VDL may not overlap the third subsidiary bank BNK3. When the third subsidiary bank BNK3 is eliminated, the touch lines TL (see FIGS. 10 and 11) disposed on the second inorganic encapsulation layer TFE3 the height of contact holes for connecting the touch lines TL (see FIGS. 10 and 11) disposed on the second inorganic encapsulation layer TFE3 with the touch bending lines disposed in the bending area BA (not shown) may be lowered. Therefore, it may be easier to form the contact holes for connecting the touch lines TL (see FIGS. 10 and 11) with the touch bending lines (not shown).

Figure 12B:
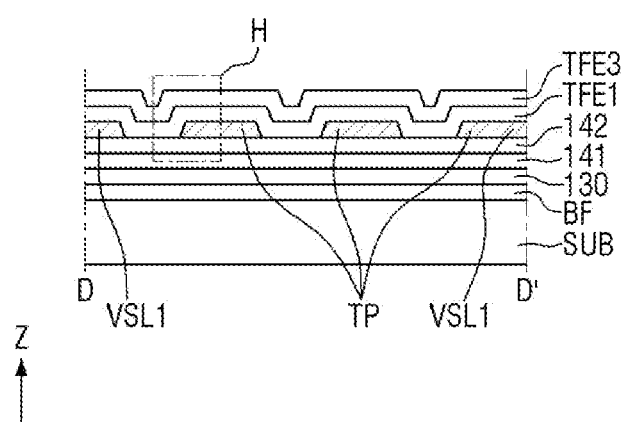
FIG. 12B is a cross-sectional view showing an example of the display panel, taken along line D-D' of FIG. 8.
Figure 12C:
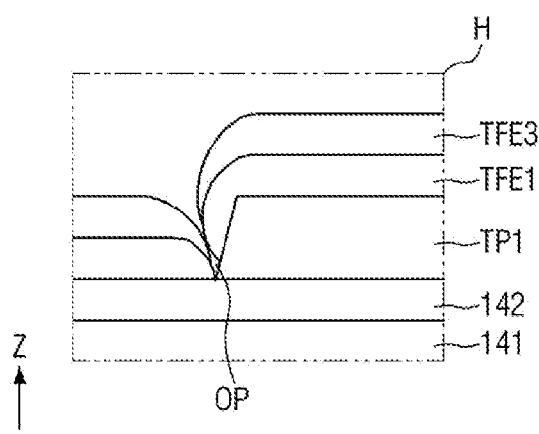
FIG. 12C is an enlarged view of area H of FIG. 12B.

FIG. 12B is a cross-sectional view showing an example of the display panel, taken along line D-D' of FIG. 8. FIG. 12C is an enlarged view of area H of FIG. 12B.

Referring to FIGS. 12B and 12C, the first subsidiary voltage supply line VSL1 and the plurality of first anti-moisture patterns TP1 may be disposed on the second interlayer dielectric layer 142 in the inorganic encapsulation area CVD. The first subsidiary voltage supply line VSL1 and the plurality of first anti-moisture patterns TP1 may be integrally formed. That is to say, the first subsidiary voltage supply line VSL1 and the plurality of first anti-moisture patterns TP1 may be made of the same material and may be disposed on the same layer.

As shown in FIG. 12C, no organic layer is disposed between the first subsidiary voltage supply line VSL1 and the first inorganic encapsulation layer TFE1 in the inorganic encapsulation area CVD. Since the step coverage of the first inorganic encapsulation layer TFE1 and the second inorganic encapsulation layer TFE2 is not good, if the slope of the side surface of the first subsidiary voltage supply line VSL1 is large, the first subsidiary voltage supply line VSL1 may not be properly covered by the first inorganic encapsulation layer TFE1 and the second inorganic encapsulation layer TFE2. That is to say, in the inorganic encapsulation area CVD, an air gap OP (see FIG. 12C) may be created in the first inorganic encapsulation layer TFE1 and the second inorganic encapsulation layer TFE2 due to the slope of the side surfaces of the first subsidiary voltage supply line VSL1. As used herein, the step coverage refers to the ability of subsequent layers to evenly cover level differences already present on the substrate without being disconnected.

In this instance, in the inorganic encapsulation area CVD, the air gap OP may be created along the side surface of the first subsidiary voltage supply line VSL1. Therefore, in the inorganic encapsulation area CVD, a path MP1 through which air or moisture permeate from the outside through the air gap OP may be formed along the side surface of the first subsidiary voltage supply line VSL1. When the first voltage supply line VSL includes a plurality of first anti-moisture patterns TP1, the length of the side surface of the first voltage supply line VSL may include the sum of the lengths of the circumference of the plurality of first anti-moisture patterns TP1. Therefore, when the first voltage supply line VSL includes the plurality of first anti-moisture patterns TP1, the length of the side surface of the first voltage supply line VSL can become longer compared to the first voltage supply line VSL without the plurality of first anti-moisture patterns TP1. Accordingly, the path MP1 of outside air or moisture through the air gap OP may become longer by virtue of the plurality of first anti-moisture patterns TP1. As a result, it is possible to delay or prevent the permeation of external air or moisture by virtue of the plurality of first anti-moisture patterns TP1. Therefore, even though the width of the inorganic encapsulation area is reduced, it is possible to prevent the organic light-emitting elements of the emission areas adjacent to the inorganic encapsulation area from being damaged by air or moisture.

Figure 13:
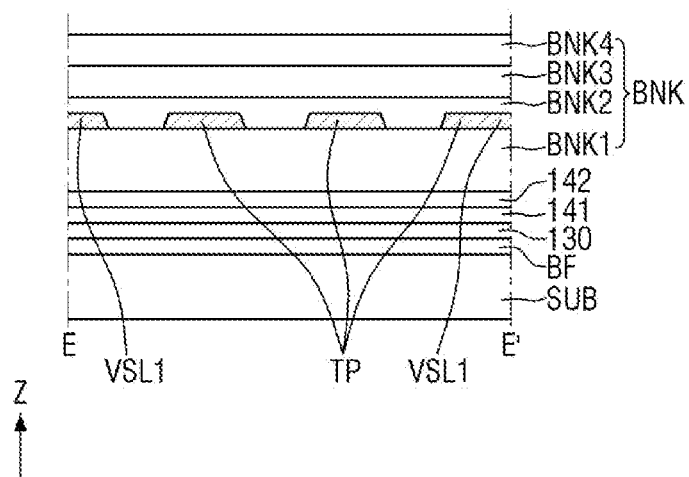
FIG. 13 is a cross-sectional view showing an example of the display panel taken along line E-E' of FIG. 9.

FIG. 13 is a cross-sectional view showing an example of the display panel taken along line E-E' of FIG. 9.

Referring to FIG. 13, in the bank area BNKA, the first subsidiary voltage supply line VSL1 and a plurality of first anti-moisture patterns TP1 may be disposed on the first subsidiary bank BNK1 which is an organic layer. The first subsidiary voltage supply line VSL1 and the plurality of first anti-moisture patterns TP1 may be integrally formed. That is to say, the first subsidiary voltage supply line VSL1 and the plurality of first anti-moisture patterns TP1 may be made of the same material and may be disposed on the same layer.

On the other hand, in the first non-display area NDA1, unlike the bank area BNKA, the first subsidiary voltage supply line VSL1 and the plurality of first anti-moisture patterns TP1 are disposed on the first organic layer 160, which is an organic layer. The redundant described will be omitted.

Figure 14:
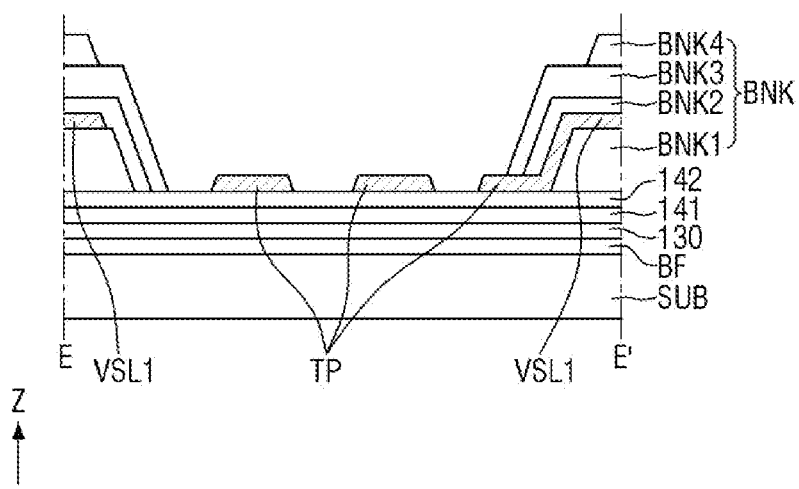
FIG. 14 is a cross-sectional view showing yet another example of the display panel taken along line E-E' of FIG. 9.

FIG. 14 is a cross-sectional view showing another example of the display panel taken along line E-E' of FIG. 9.

The embodiment of FIG. 14 is different from the embodiment of FIG. 13 in that the second subsidiary bank BNK2 is disposed on the first subsidiary voltage supply line VSL1 but the second subsidiary bank BNK2 is not disposed on the plurality of first anti-moisture patterns TP1 in the bank area BNKA.

Referring to FIG. 14, in the bank area BNKA, the first subsidiary voltage supply line VSL1 may be disposed on the first subsidiary bank BNK1, and the second subsidiary bank BNK2 may be disposed on the first subsidiary voltage supply line VSL1. In contrast, the plurality of first anti-moisture patterns TP1 may be disposed on the second interlayer dielectric layer 142, and the second subsidiary bank BNK2 may not be disposed on the plurality of first anti-moisture patterns TP1. That is to say, the plurality of first anti-moisture patterns TP1 may not overlap with the bank BNK. Accordingly, since the air gap OP of the inorganic encapsulation area CVD is not connected to the second subsidiary bank BNK2, which is an organic layer acting as a permeation path, it is possible to further delay or prevent the permeation of outside air or moisture. Therefore, it is possible to prevent the organic light-emitting elements of the emission areas adjacent to the inorganic encapsulation area from being damaged by air or moisture. In this instance, the area from which the bank BNK has been removed may have a polygonal shape such as a triangle, a square, a circular, or an elliptical shape when viewed from the top.

Figure 15:
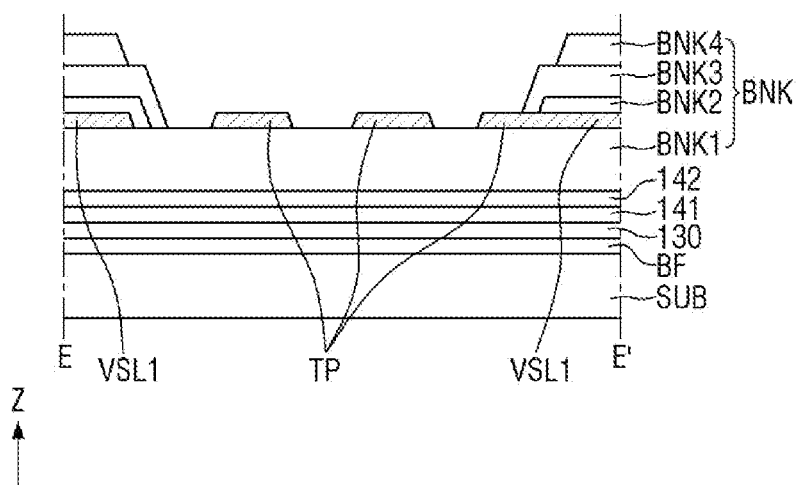
FIG. 15 is a cross-sectional view showing yet another example of the display panel taken along line E-E' of FIG. 9.

FIG. 15 is a cross-sectional view showing yet another example of the display panel taken along line E-E' of FIG. 9.

The embodiment of FIG. 15 is different from the embodiment of FIG. 13 in that the second subsidiary bank BNK2 is disposed on the first subsidiary voltage supply line VSL1 but the second subsidiary bank BNK2 is not disposed on the plurality of first anti-moisture patterns TP1 in the bank area BNKA.

Referring to FIG. 15, in the bank area BNKA, the first subsidiary voltage supply line VSL1 and a plurality of first anti-moisture patterns TP1 may be disposed on the first subsidiary bank BNK1. The second subsidiary bank BNK2 may be disposed on the first subsidiary voltage supply line VSL1 whereas the second subsidiary bank BNK2 may not be disposed on the plurality of first anti-moisture patterns TP1 in the bank area BNKA. That is to say, the plurality of first anti-moisture patterns TP1 may overlap with none of the second subsidiary bank BNK2, the third subsidiary bank BNK3 and the fourth subsidiary bank BNK4. Accordingly, since the air gap OP of the inorganic encapsulation area CVD is not connected to the second subsidiary bank BNK2, which is an organic layer acting as a permeation path, it is possible to further delay or prevent the permeation of outside air or moisture. Therefore, it is possible to prevent the organic light-emitting elements of the emission areas adjacent to the inorganic encapsulation area from being damaged by air or moisture. In this instance, the areas from which the second subsidiary bank BNK2, the third subsidiary bank BNK3 and the fourth subsidiary bank BNK4 have been removed may have a polygonal such as a triangle and a square, circular, or elliptical shape when viewed from the top.

Figure 16:
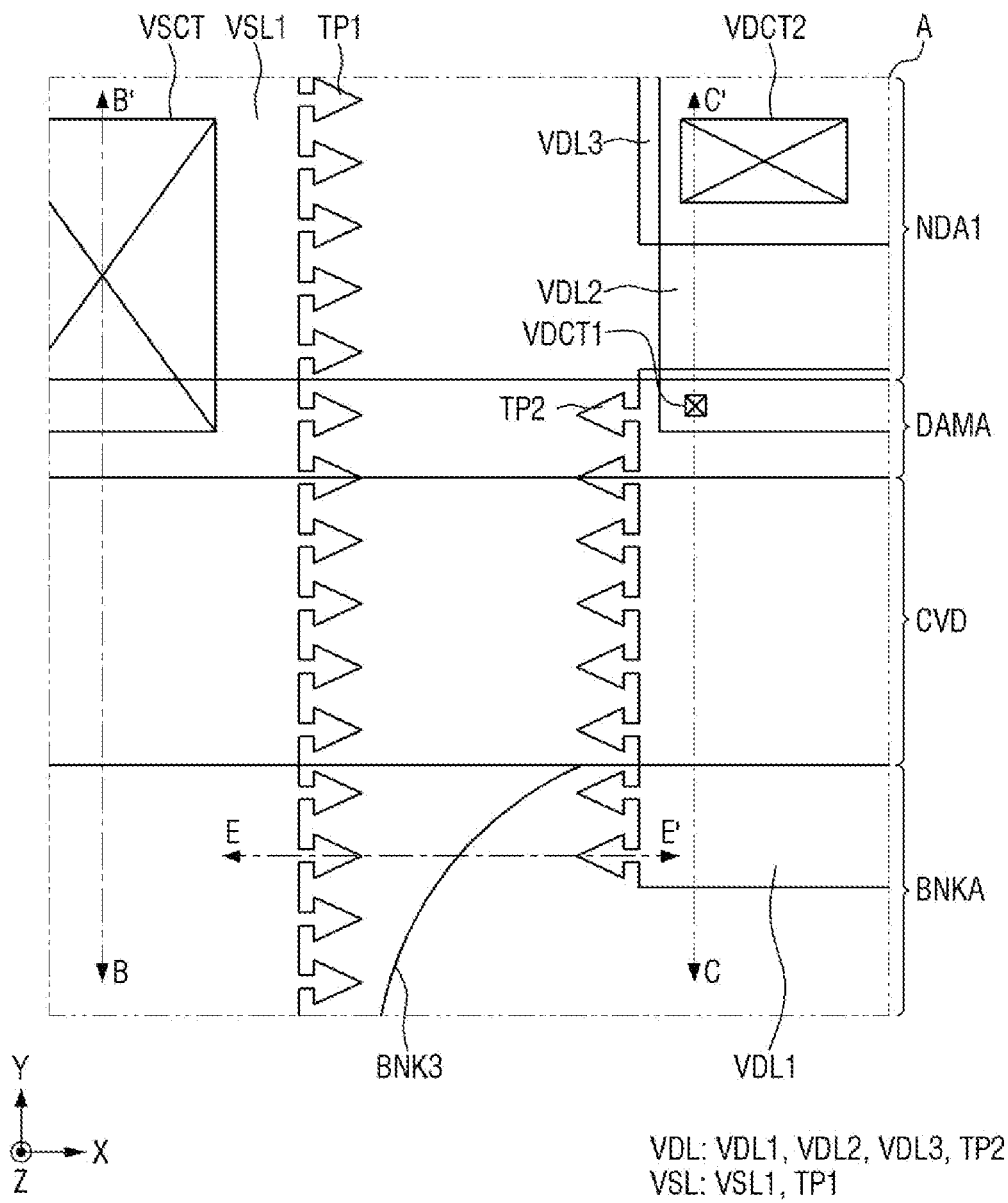
FIG. 16 is a layout diagram showing in detail a dam area, an inorganic encapsulation area, and a bank area according to yet another embodiment.

FIG. 16 is a layout diagram showing in detail a dam area, an inorganic encapsulation area, and a bank area according to another embodiment.

The embodiment of FIG. 16 is substantially identical to the embodiment of FIG. 7B except that each of a plurality of first anti-moisture patterns TP1 and a plurality of second anti-moisture patterns TP2 has a triangular shape when viewed from the top; and, therefore, the redundant descriptions will be omitted for ease in explanation of FIG. 16.

Figure 17:
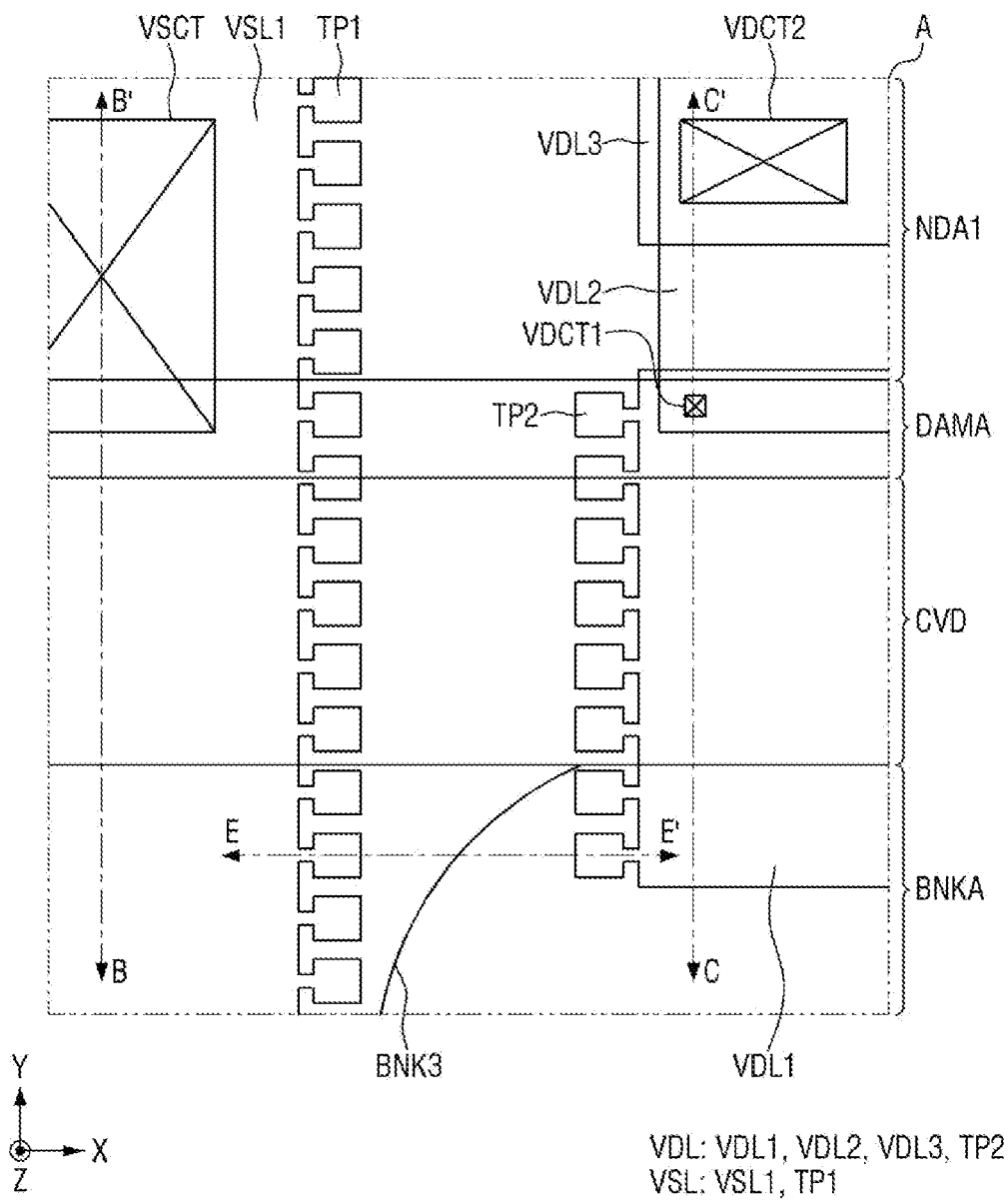
FIG. 17 is a layout diagram showing in detail a dam area, an inorganic encapsulation area, and a bank area according to yet another embodiment.

FIG. 17 is a layout diagram showing in detail a dam area, an inorganic encapsulation area, and a bank area according to yet another embodiment.

The embodiment of FIG. 17 is substantially identical to the embodiment of FIG. 7B except that each of a plurality of first anti-moisture patterns TP1 and a plurality of second anti-moisture patterns TP2 has a rectangular shape when viewed from the top; and, therefore, the redundant descriptions will be omitted for ease in explanation of FIG. 17.

Although each of the plurality of first anti-moisture patterns TP1 and the plurality of second anti-moisture patterns TP2 has the elliptical shape in the example shown in FIG. 8, has the triangular shape in the example shown in FIG. 16 and has the rectangular shape in the example shown in FIG. 17 when viewed from the top, it is to be understood that embodiments described herein are not limited thereto. The plurality of first anti-moisture patterns TP1 and the plurality of second anti-moisture patterns TP2 may have a polygonal shape other than the triangle or the rectangle, a circular shape, or an irregular shape when viewed from the top.

Figure 18:
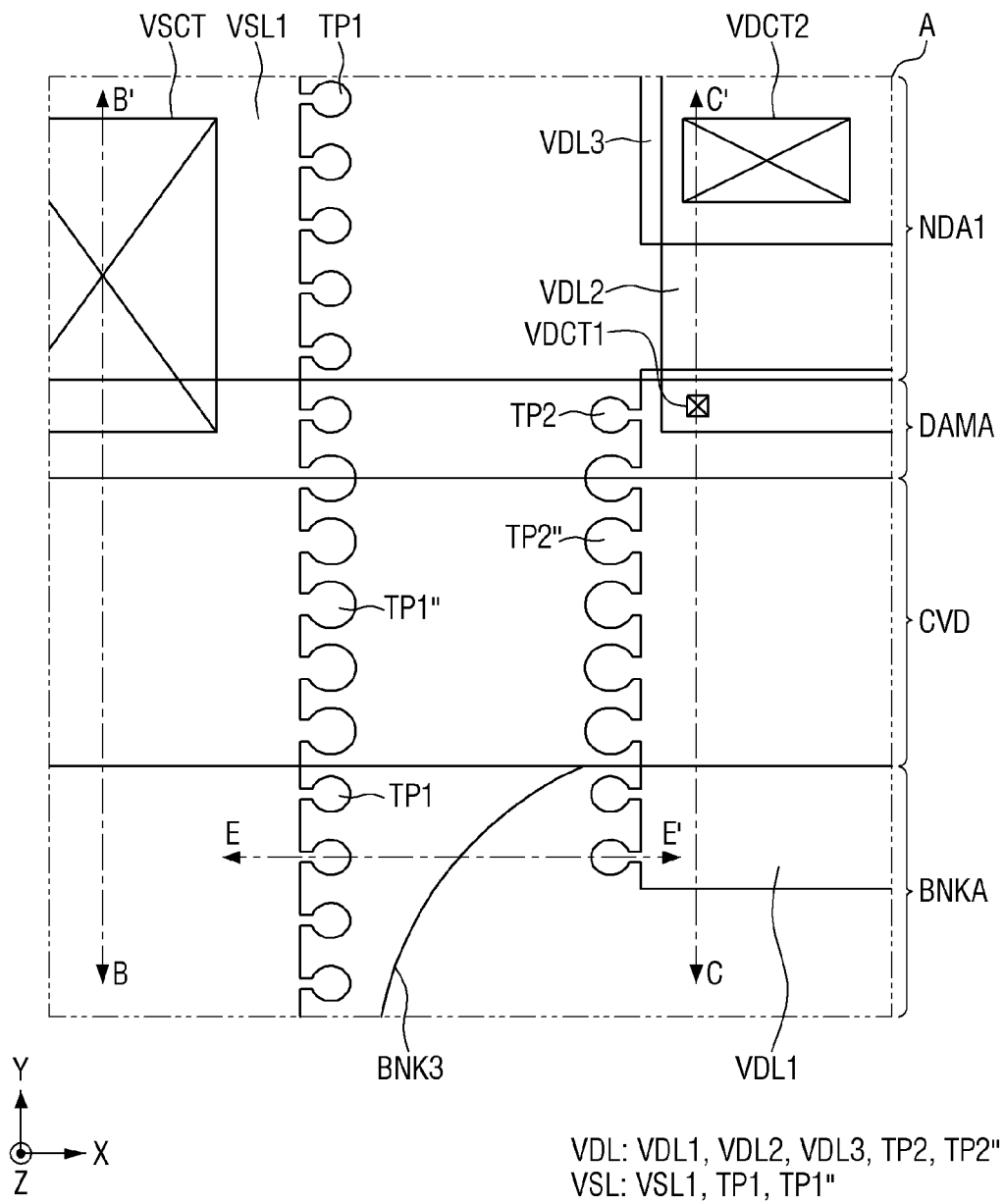
FIG. 18 is a layout diagram showing in detail a dam area, an inorganic encapsulation area, and a bank area according to yet another embodiment.
Figure 19:
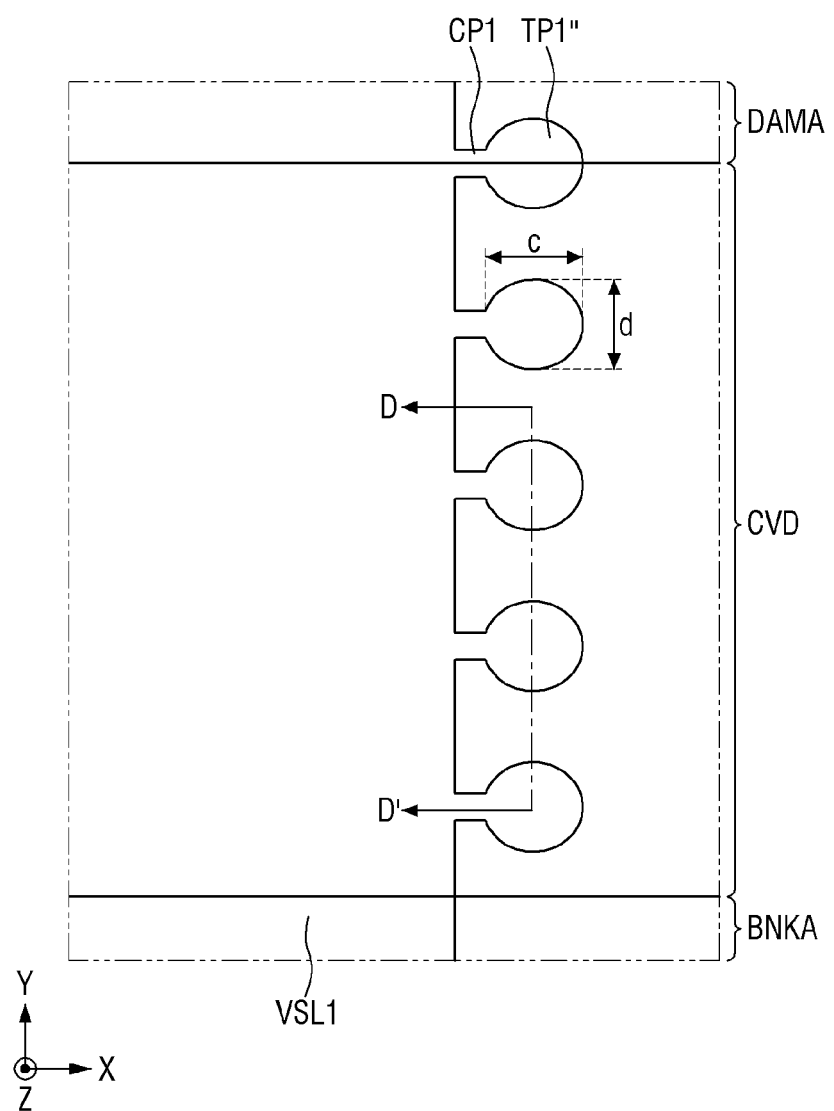
FIG. 19 is a layout diagram showing a first voltage supply line in the bank area of FIG. 18.

FIG. 18 is a layout diagram showing in detail a dam area, an inorganic encapsulation area, and a bank area according to another embodiment. FIG. 19 is a layout diagram showing a first voltage supply line in the bank area of FIG. 18.

The embodiment of FIGS. 18 and 19 is different from the embodiment of FIGS. 7B and 9 in that the size of each of a plurality of first anti-moisture patterns TP1 in the inorganic encapsulation area CVD is different from that of each of a plurality of first anti-moisture patterns TP1 in the bank area BNKA. The following description will focus on the difference.

Referring to FIGS. 18 and 19, the size of each of the plurality of first anti-moisture patterns TP1" in the inorganic encapsulation area CVD may be greater than that of each of the plurality of first anti-moisture patterns TP1 in the bank area BNKA. For example, the length (a) of each of the plurality of first anti-moisture patterns TP1" in the first direction (x-axis direction) in the inorganic encapsulation area CVD as shown in FIG. 18 may be larger than the length (c) of each of the plurality of first anti-moisture patterns TP1 in the first direction (x-axis direction) in the bank area BNKA as shown in FIG. 18. In addition, the length (b) of each of the plurality of first anti-moisture patterns TP1" in the second direction (y-axis direction) in the inorganic encapsulation area CVD as shown in FIG. 18 may be larger than the length (d) of each of the plurality of first anti-moisture patterns TP1 in the second direction (y-axis direction) in the bank area BNKA as shown in FIG. 18 (please also see FIG. 19).

Since the size of each of the plurality of first anti-moisture patterns TP1 in the inorganic encapsulation area CVD is different from the size of each of the plurality of first anti-moisture patterns TP1" in the bank area BNKA, the length and/or the width of the first anti-moisture patterns TP1 in the inorganic encapsulation area CVD may be different from the length and/or the width of the plurality of first anti-moisture patterns TP1" in the bank area BNKA. In addition, since the size of each of the plurality of first anti-moisture patterns TP1 in the inorganic encapsulation area CVD is different from the size of each of the plurality of first anti-moisture patterns TP1" in the first non-display area NDA1, the length and/or the width of the first anti-moisture patterns TP1 in the inorganic encapsulation area CVD may be different from the length and/or the width of the plurality of first anti-moisture patterns TP1" in the first non-display area NDA1. The difference in size of the anti-moisture patterns may be referenced to a 'unit area', in which the unit area may be a predetermined area. For example, the unit area may be equal to an area defined by x μm in the first direction (x-axis direction) and y μm in the second direction (y-axis direction).

When the width of the inorganic encapsulation area CVD is reduced as the display area DA is expanded while the non-display area NDA is reduced, by increasing the size of the plurality of first anti-moisture patterns TP1 in the inorganic encapsulation layer area CVD, the path MP1 of the outside air or moisture through the air gap OP (see FIG. 12C) in the inorganic encapsulation area CVD can be equal to or greater than 540 μm. That is to say, the size of each of the plurality of first anti-moisture patterns TP1 of the inorganic encapsulation area CVD varies depending on the width of the inorganic encapsulation area CVD, but the size of each of the plurality of first anti-moisture patterns TP1 in the bank area BNKA may not necessarily do so. Therefore, the size of each of the plurality of first anti-moisture patterns TP1 in the inorganic encapsulation area CVD may be larger than that of each of the plurality of first anti-moisture patterns TP1" in the bank area BNKA.

In addition, the size of each of the plurality of first anti-moisture patterns TP1 in the inorganic encapsulation area CVD may be larger than that of each of the plurality of first anti-moisture patterns TP1" in the dam area DAMA and the non-display area NDA1. In such case, the size of each of the plurality of first anti-moisture patterns TP1" in the dam area DAMA and the non-display area NDA1 may be substantially identical to the size of each of the plurality of first anti-moisture patterns TP1" in the bank BNKA. It is, however, to be understood that embodiments described herein are not limited thereto.

Moreover, the size of each of the plurality of second anti-moisture patterns TP2 in the inorganic encapsulation area CVD may be larger than that of each of the plurality of second anti-moisture patterns TP2" in the bank area BNKA. In addition, the size of each of the plurality of second anti-moisture patterns TP2 in the inorganic encapsulation area CVD may be larger than that of each of the plurality of second anti-moisture patterns TP2" in the dam area DAMA and the non-display area NDA1. In such case, the size of each of the plurality of first anti-moisture patterns TP1" in the dam area DAMA and the non-display area NDA1 may be substantially identical to the size of each of the plurality of second anti-moisture patterns TP2" in the bank BNKA. It is, however, to be understood that embodiments described herein are not limited thereto.

In such case, since the size of each of the plurality of second anti-moisture patterns TP2 in the inorganic encapsulation area CVD is different from the size of each of the plurality of first anti-moisture patterns TP1" in the bank area BNKA, the length and/or the width of the second anti-moisture patterns TP2 in the inorganic encapsulation area CVD may be different from the length and/or the width of the plurality of second anti-moisture patterns TP2" in the bank area BNKA. In addition, since the size of each of the plurality of second anti-moisture patterns TP2 in the inorganic encapsulation area CVD is different from the size of each of the plurality of second anti-moisture patterns TP2" in the first non-display area NDA1, the length and/or the width of the second anti-moisture patterns TP2 in the inorganic encapsulation area CVD may be different from the length and/or the width of the plurality of second anti-moisture patterns TP2" in the first non-display area NDA1. The difference in size of the anti-moisture patterns may be referenced to a 'unit area', in which the unit area may be a predetermined area. For example, the unit area may be equal to an area defined by x μm in the first direction (x-axis direction) and y μm in the second direction (y-axis direction).

Figure 20:
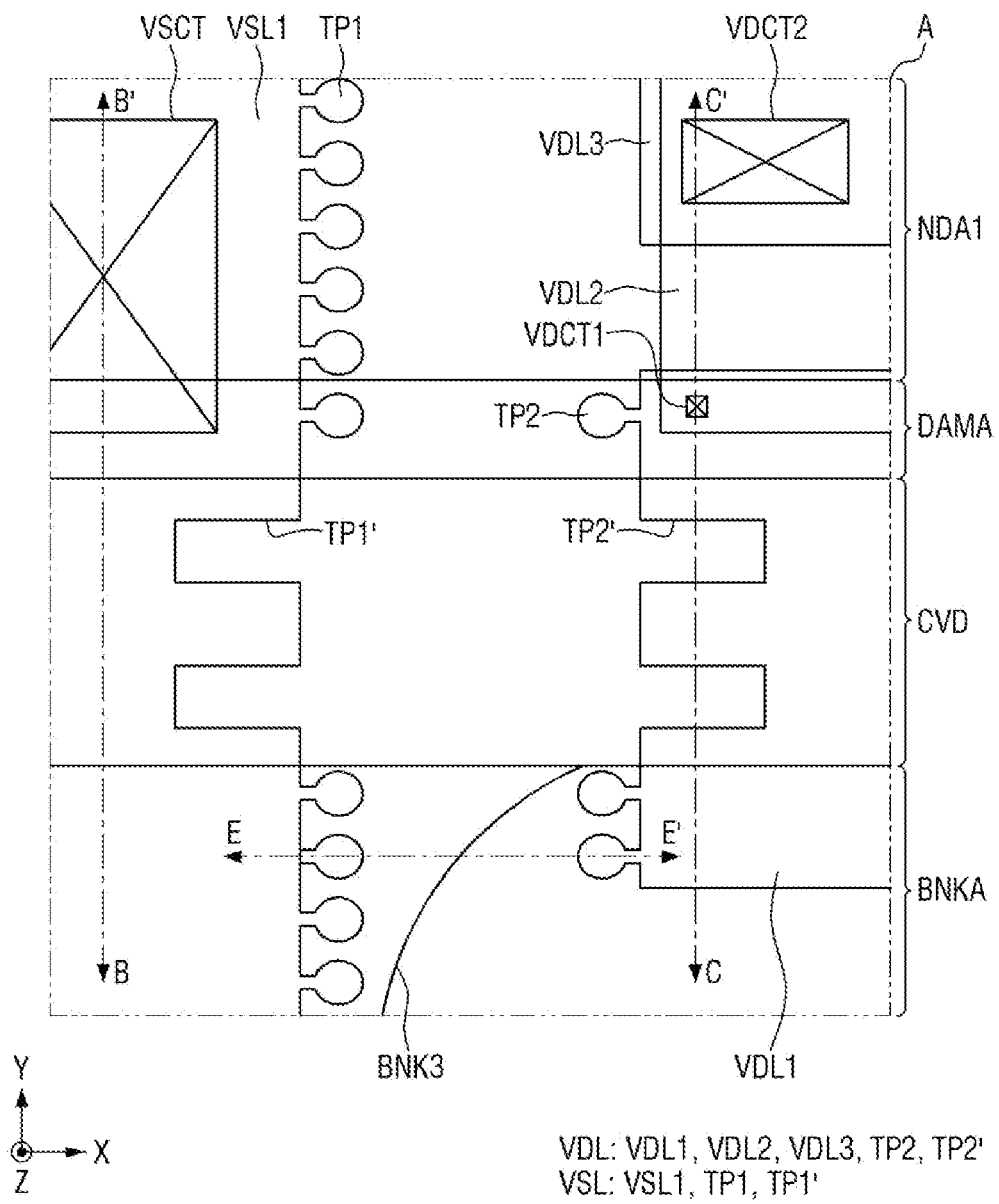
FIG. 20 is a layout diagram showing in detail a dam area, an inorganic encapsulation area, and a bank area according to yet another embodiment.
Figure 21:
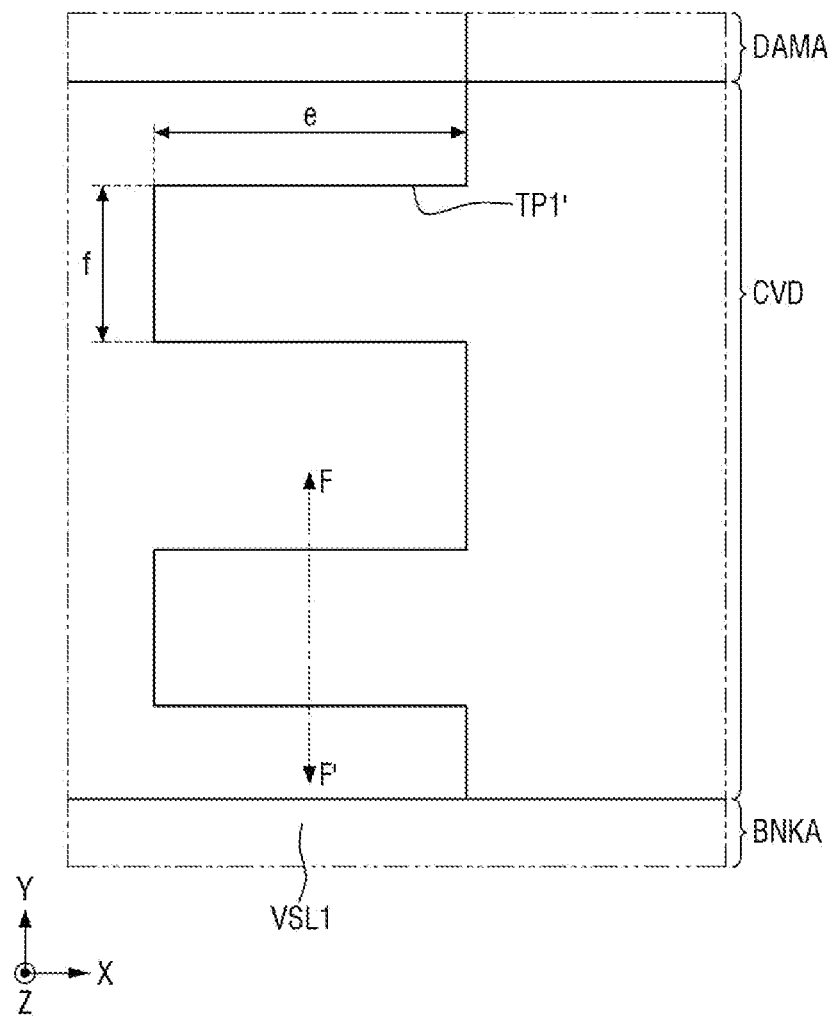
FIG. 21 is a layout diagram showing the first voltage supply line in the inorganic encapsulation area of FIG. 20.

FIG. 20 is a layout diagram showing in detail a dam area, an inorganic encapsulation area, and a bank area according to yet another embodiment. FIG. 21 is a layout diagram showing the first voltage supply line in the inorganic encapsulation area of FIG. 20.

The embodiment of FIGS. 20 and 21 is different from the embodiment of FIGS. 7B and 8 in that each of a plurality of first anti-moisture patterns TP1' in the inorganic encapsulation area CVD is recessed from one side of the first subsidiary voltage supply line VSL1. The following description will focus on the difference.

Referring to FIGS. 20 and 21, each of the plurality of first anti-moisture patterns TP1' in the inorganic encapsulation area CVD may have a shape such as a groove recessed from one side of the first subsidiary voltage supply line VSL1 in the first direction (x-axis direction). The groove may have a rectangular shape when viewed from the top, but embodiments described herein are not limited thereto. The groove may have a polygonal shape other than a rectangle, such as a triangle, a circle, or an elliptic when viewed from the top.

In the inorganic encapsulation area CVD, the air gap OP (see FIG. 12C) may be formed along the side surface of the first subsidiary voltage supply line VSL1. Therefore, in the inorganic encapsulation area CVD, a path MP3 through which air or moisture permeate from the outside through the air gap OP (see FIG. 12C) may be formed along the side surface of the first subsidiary voltage supply line VSL1. When the first voltage supply line VSL includes a plurality of first anti-moisture patterns TP1', the length of the side surface of the first voltage supply line VSL may include the sum of the lengths of the circumference of the plurality of first anti-moisture patterns TP1'. Therefore, when the first voltage supply line VSL includes the plurality of first anti-moisture patterns TP1', the length of the side surface of the first voltage supply line VSL can become longer compared to the first voltage supply line VSL without the plurality of first anti-moisture patterns TP1'. Accordingly, the path MP3 of outside air or moisture through the air gap OP (see FIG. 12C) may become longer by virtue of the plurality of first anti-moisture patterns TP1'. As a result, it is possible to delay or prevent the permeation of external air or moisture by virtue of the plurality of first anti-moisture patterns TP1'. Therefore, even though the width of the inorganic encapsulation area is reduced, it is possible to prevent the organic light-emitting elements of the emission areas adjacent to the inorganic encapsulation area from being damaged by air or moisture.

The length (e) of each of the plurality of first anti-moisture patterns TP1' in the first direction (x-axis direction) may be larger than the length (f) in the second direction (y-axis direction), but embodiments described herein are not limited thereto. As the length (e) in the first direction (x-axis direction) and the length (f) in the second direction (y-axis direction) of each of the plurality of first anti-moisture patterns TP1' increase, the circumference of each of the plurality of first anti-moisture patterns TP1' may become longer. Recently, in order to widen the display area DA, the non-display area NDA is reduced. Accordingly, the width of the inorganic encapsulation area CVD is reduced. Although the number of first anti-moisture patterns TP1' decreases as the width of the inorganic encapsulation area CVD is reduced, when the length (e) in the first direction (x-axis direction) and/or the length (f) in the second direction (y-axis direction) of each of the plurality of first anti-moisture patterns TP1' are increased, the path MP3 of the outside air or moisture through the air gap OP (see FIG. 12C) in the inorganic encapsulation area CVD may not be reduced. According to experiments conducted by the inventors of the application, it was possible to delay or prevent the permeation of outside air or moisture if the path MP1 of outside air or moisture through the air gap OP (see FIG. 12C) in the inorganic encapsulation area CVD is 540 μm or more.

Table 2 shows the width of the inorganic encapsulation area CVD, the number of the first anti-moisture patterns TP1, the length (a) in the first direction (x-axis direction) and the length (b) in the second direction (y-axis direction) of the first anti-moisture patterns TP1, and the total perimeter of the plurality of first anti-moisture patterns TP1 in the inorganic encapsulation area CVD.

TABLE 2

|  | 1 | 2 | 3 | 4 |
|---|---|---|---|---|
| Width of inorganic encapsulation area CVD | 50 μm | 25 μm | 50 μm | 25 μm |
| Number (n) of the first anti-moisture patterns TP1' | 2 | 2 | 2 | 2 |
| Length (a) in the first direction (x-axis direction) of the first anti-moisture patterns TP1' | 125 μm | 132 μm | 135 μm | 137 μm |
| Length (b) in the second direction (y-axis direction) of the first anti-moisture patterns TP1' | 20 μm | 10 μm | 10 μm | 5 μm |
| The total perimeter of the plurality of first anti-moisture patterns TP1 in the inorganic encapsulation area CVD | 540 μm | 548 μm | 560 μm | 558 μm |

In Table 2, the total perimeter of the plurality of first anti-moisture patterns TP1 in the inorganic encapsulation area CVD may be defined as "2(a+b)×n".

Referring to Table 2, when the width of the inorganic encapsulation area CVD is 50 μm, and two first anti-moisture patterns TP1 having the length (a) in the first direction (x-axis direction) of 125 μm and the length (b) in the second direction (y-axis direction) of 20 μm are disposed, the total perimeter of the plurality of first anti-moisture patterns TP1 in the inorganic encapsulation area CVD may be approximately 540 μm. In this case, it is possible to delay or prevent the permeation of outside air or moisture because the path MP1 of outside air or moisture through the air gap OP (see FIG. 12C) in the inorganic encapsulation area CVD is equal to or greater than 540 μm.

When the width of the inorganic encapsulation area CVD is 25 μm, and two first anti-moisture pattern TP1 having the length (a) in the first direction (x-axis direction) of 132 μm and the length (b) in the second direction (y-axis direction) of 10 μm are disposed, the total perimeter of the plurality of first anti-moisture patterns TP1 in the inorganic encapsulation area CVD may be approximately 548 μm. In this case, it is possible to delay or prevent the permeation of outside air or moisture because the path MP1 of outside air or moisture through the air gap OP (see FIG. 12C) in the inorganic encapsulation area CVD is equal to or greater than 540 μm.

When the width of the inorganic encapsulation area CVD is 50 μm, and two first anti-moisture pattern TP1 having the length (a) in the first direction (x-axis direction) of 135 μm and the length (b) in the second direction (y-axis direction) of 10 μm are disposed, the total perimeter of the plurality of first anti-moisture patterns TP1 in the inorganic encapsulation area CVD may be approximately 560 μm. In this case, it is possible to delay or prevent the permeation of outside air or moisture because the path MP1 of outside air or moisture through the air gap OP (see FIG. 12C) in the inorganic encapsulation area CVD is equal to or greater than 540 μm.

When the width of the inorganic encapsulation area CVD is 25 µm, and two first anti-moisture patterns TP1 having the length (a) in the first direction (x-axis direction) of 137 µm and the length (b) in the second direction (y-axis direction) of 5 µm are disposed, the total perimeter of the plurality of first anti-moisture patterns TP1 in the inorganic encapsulation area CVD may be approximately 558 µm. In this case, it is possible to delay or prevent the permeation of outside air or moisture because the path MP1 of outside air or moisture through the air gap OP (see FIG. 12C) in the inorganic encapsulation area CVD is equal to or greater than 540 µm.

As can be seen from Table 2, even though the width of the inorganic encapsulation area CVD is reduced, it is possible to control the total perimeter of the plurality of first anti-moisture patterns TP1' in the inorganic encapsulation area CVD by adjusting the number of the first anti-moisture patterns TP1' and the length (a) in the first direction (x-axis direction) and the length (b) in the second direction (y-axis direction) of the first anti-moisture patterns TP1'. For example, although the number of first anti-moisture patterns TP1' decreases as the width of the inorganic encapsulation area CVD is reduced, by increasing the length (a) in the first direction (x-axis direction) and/or the length (b) in the second direction (y-axis direction) of each of the plurality of first anti-moisture patterns TP1', the path MP3 of the outside air or moisture through the air gap OP (see FIG. 12C) in the inorganic encapsulation area CVD may be equal to or greater than 540 µm. Therefore, it is possible to delay or prevent the permeation of outside air or moisture by virtue of the plurality of first anti-moisture patterns TP1'. Therefore, even though the width of the inorganic encapsulation area is reduced, it is possible to prevent the organic light-emitting elements of the emission areas adjacent to the inorganic encapsulation area from being damaged by air or moisture.

Moreover, each of the plurality of second anti-moisture patterns TP2' in the inorganic encapsulation area CVD may have a shape such as a groove recessed from one side of the third subsidiary voltage supply line VDL1 in the first direction (x-axis direction). The groove may have a rectangular shape when viewed from the top, but embodiments of described herein are not limited thereto. The groove may have a shape of a polygonal shape other than a rectangle, like a triangle, a circle or an elliptic when viewed from the top. Besides, the plurality of second anti-moisture patterns TP2' is substantially identical to the plurality of first anti-moisture pattern TP1'; and, therefore, the redundant descriptions will be omitted.

Figure 22:
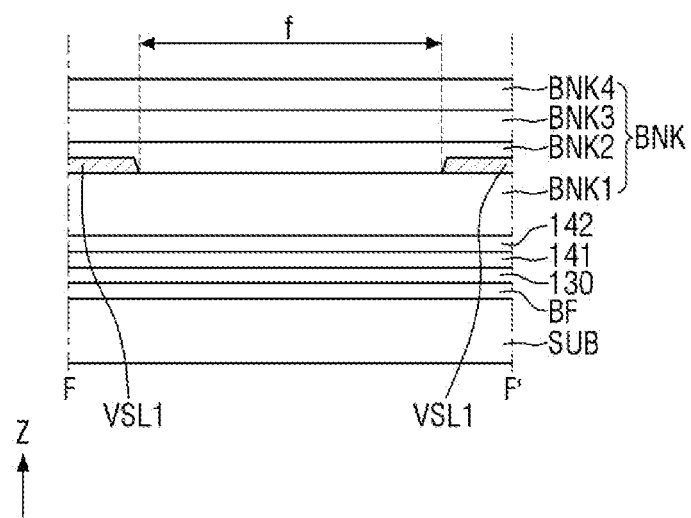
FIG. 22 is a cross-sectional view showing an example of the display panel taken along line F-F' of FIG. 21.

FIG. 22 is a cross-sectional view showing an example of the display panel taken along line F-F' of FIG. 21.

Referring to FIG. 22, a first subsidiary voltage supply line VSL1 may be disposed on a first subsidiary bank BNK1. The first subsidiary voltage supply line VSL1 may be spaced apart from another one by a length f of the first anti-moisture pattern TP1' in the second direction (y-axis direction).

Figure 23:
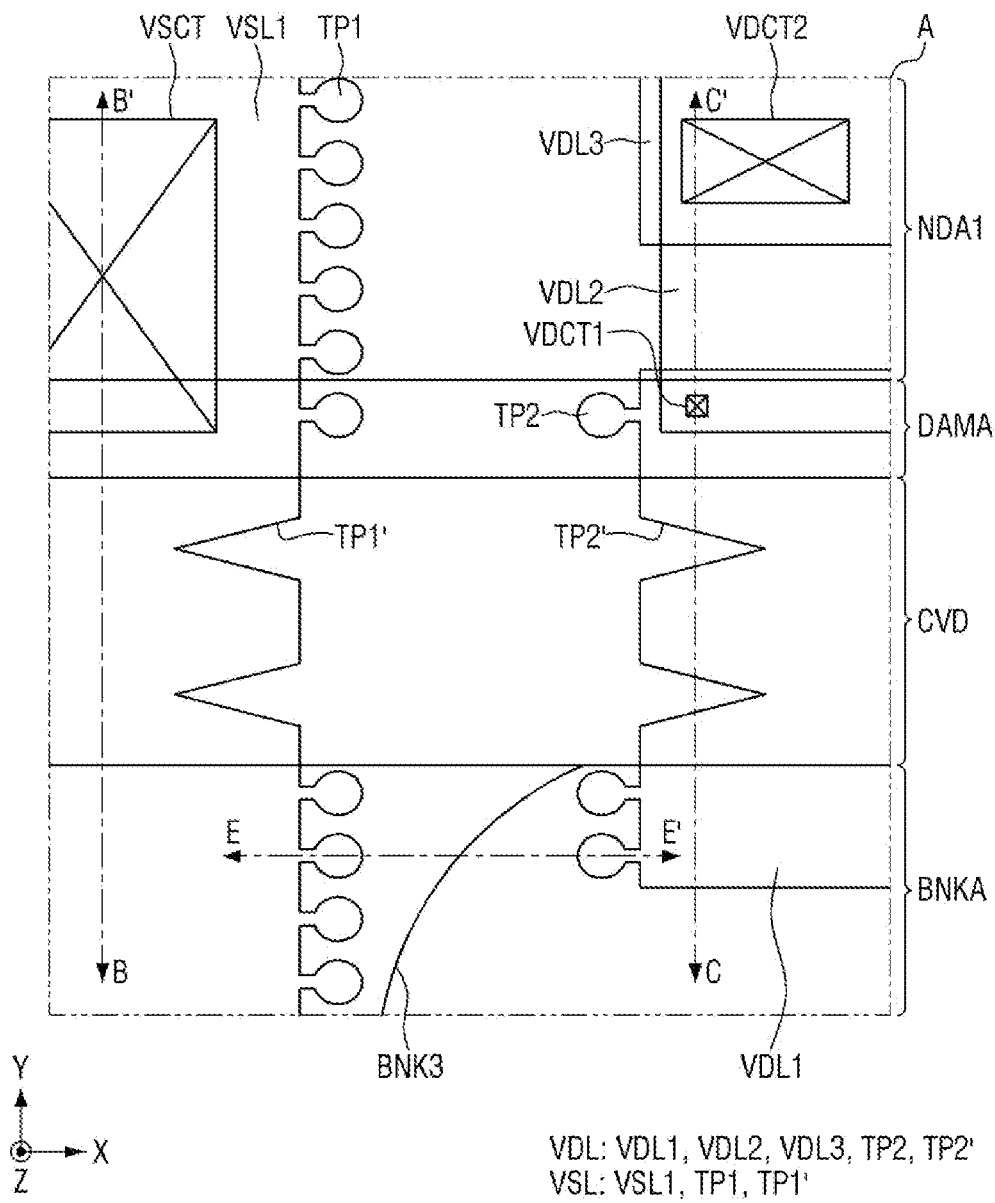
FIG. 23 is a layout diagram showing in detail a dam area, an inorganic encapsulation area, and a bank area.

FIG. 23 is a layout diagram showing in detail a dam area, an inorganic encapsulation area, and a bank area according to yet another embodiment.

The embodiment of FIG. 23 is substantially identical to the embodiment of FIG. 20 except that each of grooves formed by a plurality of first anti-moisture patterns TP1' and a plurality of second anti-moisture patterns TP2' has a triangular shape when viewed from the top; and, therefore, the redundant descriptions will be omitted for ease in explanation of FIG. 23.

Figure 24:
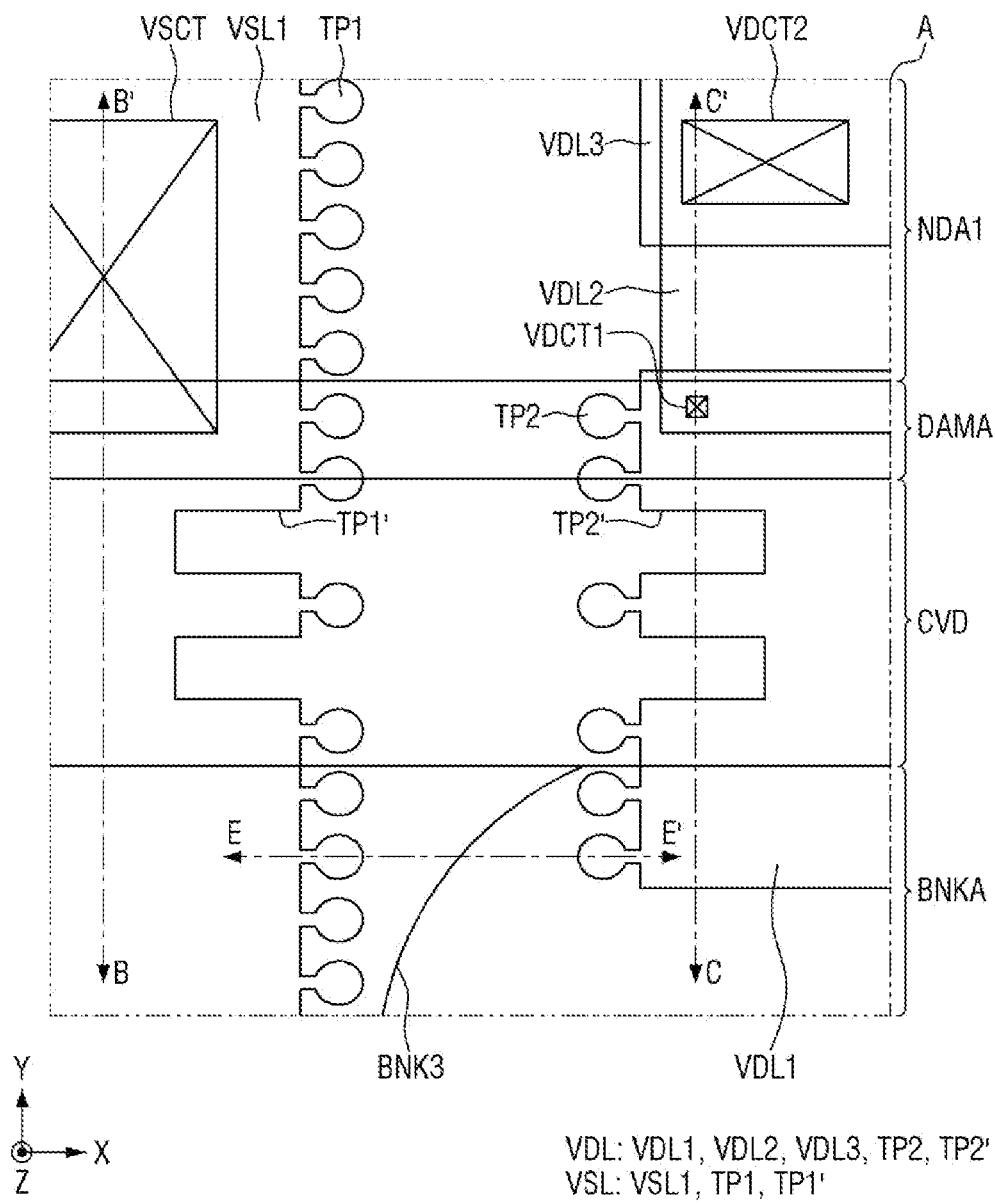
FIG. 24 is a layout diagram showing in detail a dam area, an inorganic encapsulation area, and a bank area.

FIG. 24 is a layout diagram showing in detail a dam area, an inorganic encapsulation area, and a bank area according to yet another embodiment.

The embodiment of FIG. 24 is substantially identical to the embodiment of FIG. 7B except that a plurality of first anti-moisture patterns TP protruding from one side of a first subsidiary voltage supply line VSL1 is disposed, in addition to a plurality of first anti-moisture patterns TP1' recessed from the side of the first subsidiary voltage supply line VSL1 in the inorganic encapsulation area CVD; and, therefore, the redundant descriptions will be omitted for ease in explanation of FIG. 24.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate comprising a display area and a non-display area;
a pixel electrode disposed on the display area of the substrate;
an organic emissive layer disposed on the pixel electrode;
a common electrode disposed on the organic emissive layer;
a first inorganic encapsulation layer disposed on the common electrode;
an organic encapsulation layer disposed on the first inorganic encapsulation layer;
a second inorganic encapsulation layer disposed on the organic encapsulation layer;
a dam disposed on the non-display area of the substrate;
a bank disposed on the non-display area of the substrate and disposed closer to a peripheral edge of the substrate than the dam;
an inorganic encapsulation area located between the dam and the bank in the non-display area of the substrate, wherein the first inorganic encapsulation layer is in contact with the second inorganic encapsulation layer in the inorganic encapsulation area; and
a first voltage supply line disposed in a dam area where the dam is disposed, in a bank area where the bank is disposed, and in the inorganic encapsulation area in the non-display area of the substrate,
wherein the first voltage supply line comprises a first subsidiary voltage supply line; and a plurality of first anti-moisture patterns protruding from one side of the first subsidiary voltage supply line in plan view and disposed in the inorganic encapsulation area and the bank area, and
wherein both a length and a width of the plurality of first anti-moisture patterns in the inorganic encapsulation area is respectively different from a length and a width of the plurality of first anti-moisture patterns in the bank area.

2. The display device of claim 1, patterns has one or more of a circular, elliptical, or polygonal shape in plan view.

3. The display device of claim 1, further comprising a second voltage supply line disposed in the dam area where the dam is disposed, in the bank area where the bank is disposed, and in the inorganic encapsulation area in the non-display area of the substrate, wherein the second voltage supply line comprises a second subsidiary voltage supply line; and a plurality of second anti-moisture patterns protruding from one side of the second subsidiary voltage supply line in plan view and disposed in the inorganic encapsulation area and the bank area, and wherein the plurality of second anti-moisture patterns protrude from the one side of the second subsidiary voltage supply line to extend in a direction closer to the plurality of second anti-moisture patterns than other portions of the second subsidiary voltage supply line.

4. The display device of claim 1, wherein the first voltage supply line is extended in a first direction, and wherein a size of each of the plurality of first anti-moisture patterns in the first direction is equal to a size thereof in a second direction crossing the first direction.

5. The display device of claim 1, wherein the first voltage supply line is extended in a first direction, and wherein a size of each of the plurality of first anti-moisture patterns in the first direction is smaller than a size thereof in a second direction crossing the first direction.

6. The display device of claim 1, wherein the plurality of first anti-moisture patterns is disposed in the bank area.

7. The display device of claim 6, wherein a size of one of the plurality of first anti-moisture patterns disposed in the inorganic encapsulation area is different from a size of one of the plurality of first anti-moisture patterns disposed in the bank area.

8. The display device of claim 7, wherein the bank comprises:

a first bank disposed on the substrate;
    a second bank disposed on the first bank;
    a third bank disposed on the second bank; and
    a fourth bank disposed on the third bank.

9. The display device of claim 8, wherein the plurality of first anti-moisture patterns is disposed on the first bank.

10. The display device of claim 8, wherein the plurality of first anti-moisture patterns overlap with none of the second bank, the third bank and the fourth bank.

11. The display device of claim 8, wherein the plurality of first anti-moisture patterns overlap with none of the first bank, the second bank, the third bank and the fourth bank.

12. The display device of claim 1, wherein the plurality of first anti-moisture patterns is disposed in the dam area.

13. The display device of claim 1, wherein the plurality of first anti-moisture patterns is disposed in a first non-display area between the dam and the display area.

14. The display device of claim 13, wherein a size of one of the plurality of first anti-moisture patterns disposed in the inorganic encapsulation area is different from a size of one of the plurality of first anti-moisture patterns disposed in the first non-display area.

15. The display device of claim 13, wherein at least one of a length and a width of the plurality of first anti-moisture patterns in the inorganic encapsulation area is respectively different from a length and a width of the plurality of first anti-moisture patterns in the first non-display area.

16. The display device of claim 13, wherein the first voltage supply line further comprises: a second subsidiary voltage supply line connected to the first subsidiary voltage supply line through a first voltage supply contact hole in the first non-display area.

17. The display device of claim 16, wherein the first voltage supply contact hole is located in the dam area.

\* \* \* \* \*